US010139462B2

United States Patent
Baek et al.

(10) Patent No.: US 10,139,462 B2
(45) Date of Patent: Nov. 27, 2018

(54) MAGNETIC RESONANCE IMAGING APPARATUS AND MAGNETIC RESONANCE SPECTROSCOPIC METHOD USING THE SAME

(71) Applicants: SAMSUNG ELECTRONICS CO., LTD., Suwon-si (KR); KOREA BASIC SCIENCE INSTITUTE, Daejeon (KR)

(72) Inventors: Hyeon-Man Baek, Ochang-eup (KR); Nam Gyun Lee, Ochang-eup (KR); Chae Joon Cheong, Ochang-eup (KR)

(73) Assignees: SAMSUNG ELECTRONICS CO., LTD., Suwon-si (KR); KOREA BASIC SCIENCE INSTITUTE, Daejeon (KR)

( * ) Notice: Subject to any disclaimer, the term of this patent is extended or adjusted under 35 U.S.C. 154(b) by 334 days.

(21) Appl. No.: 15/012,978

(22) Filed: Feb. 2, 2016

(65) Prior Publication Data

US 2016/0223632 A1     Aug. 4, 2016

(30) Foreign Application Priority Data

Feb. 2, 2015     (KR) .................. 10-2015-0015930

(51) Int. Cl.
*G01R 33/46*     (2006.01)
*G01R 33/465*     (2006.01)

(52) U.S. Cl.
CPC ........ *G01R 33/4625* (2013.01); *G01R 33/465* (2013.01)

(58) Field of Classification Search
CPC .......................... G01R 33/4625; G01R 33/465
See application file for complete search history.

(56) References Cited

U.S. PATENT DOCUMENTS

2005/0137476 A1*     6/2005  Weiland ............. G01R 33/4625
                                                              600/416
2009/0030618 A1*     1/2009  Cheng .................. G01R 33/485
                                                               702/19

(Continued)

FOREIGN PATENT DOCUMENTS

JP          2009-291348 A       12/2009
KR     10-2004-0032064 A         4/2004

(Continued)

OTHER PUBLICATIONS

Communication dated Mar. 4, 2016, issued by the Korean Intellectual Property Office in counterpart Korean Application No. 10-2015-0015930.

(Continued)

*Primary Examiner* — Rodney Bonnette
(74) *Attorney, Agent, or Firm* — Sughrue Mion, PLLC

(57) ABSTRACT

A magnetic resonance imaging (MRI) apparatus and a magnetic resonance spectroscopic method are provided. The MRI apparatus includes a data collector configured to obtain reference data of reference substances, and obtain measurement data of a target region of a subject. The MRI apparatus further includes a processor configured to determine a reference substance of the target region, among the reference substances, and a concentration of the reference substance, using the reference data, the measurement data, and an external factor compensation value compensating an external factor affecting the measurement data.

30 Claims, 26 Drawing Sheets

(56) References Cited

U.S. PATENT DOCUMENTS

| | | | |
|---|---|---|---|
| 2010/0072994 A1* | 3/2010 | Lee | G01N 24/08 |
| | | | 324/307 |
| 2013/0289887 A1* | 10/2013 | Huber | G01N 24/08 |
| | | | 702/19 |
| 2013/0320979 A1 | 12/2013 | Yang | |
| 2015/0042328 A1* | 2/2015 | Huber | G01R 33/4625 |
| | | | 324/308 |
| 2015/0247813 A1* | 9/2015 | Fischer | G01N 21/27 |
| | | | 702/23 |
| 2017/0176549 A1* | 6/2017 | Krapf | G01R 33/28 |

FOREIGN PATENT DOCUMENTS

| KR | 10-2009-0042632 A | 4/2009 |
|---|---|---|
| WO | 2007/013423 A1 | 2/2007 |

OTHER PUBLICATIONS

Communication dated Sep. 6, 2016 issued by the Korean Intellectual Property Office in counterpart Korean Patent Application No. 10-2015-0015930.

Communication dated Nov. 3, 2016 issued by the Korean Intellectual Patent Office in counterpart Korean Patent Application No. 10-2015-0015930.

* cited by examiner

MAGNETIC RESONANCE IMAGING APPARATUS AND MAGNETIC RESONANCE SPECTROSCOPIC METHOD USING THE SAME

CROSS-REFERENCE TO RELATED APPLICATION

This application claims priority from Korean Patent Application No. 10-2015-0015930, filed on Feb. 2, 2015, in the Korean Intellectual Property Office, the disclosure of which is incorporated herein in its entirety by reference.

BACKGROUND

1. Field

Methods and apparatuses consistent with exemplary embodiments relate to a magnetic resonance imaging apparatus and a magnetic resonance spectroscopic method using the magnetic resonance imaging apparatus.

2. Description of the Related Art

An image capturing apparatus refers to an apparatus for obtaining exterior or interior images of an object using visible rays, infrared rays, ultrasounds, radioactive rays, Nuclear Magnetic Resonance (NMR) or the like, and providing the images for the user. The image capturing apparatus may control at least one of contrast, brightness, and sharpness of an entire or a part of an image created.

The image capturing apparatus may include a camera, an infrared camera, an ultrasonic imaging apparatus, a digital radiographic apparatus, a computed tomographic (CT) apparatus, a mammographic apparatus, or a magnetic resonance imaging (MRI) apparatus.

The MRI apparatus refers to an apparatus for obtaining a cross-sectional image of an inside of a subject such as a human, an animal, or a plant, via the NMR. The NMR is a phenomenon in which the nuclei are resonant with radio frequency (RF) pulses at a frequency. The MRI apparatus may obtain MRI images, using magnetic resonance signals induced by a magnetization vector of the nuclei exposed to a magnetic field to a nearby RF coil, i.e., free induction decay (FID) signals.

SUMMARY

Exemplary embodiments may address at least the above problems and/or disadvantages and other disadvantages not described above. Also, the exemplary embodiments are not required to overcome the disadvantages described above, and an exemplary embodiment may not overcome any of the problems described above.

One or more exemplary embodiments include a magnetic resonance imaging (MRI) apparatus and a magnetic resonance spectroscopic (MRS) method using the same.

According to an aspect of an exemplary embodiment, an MRS method includes obtaining, by an MRI apparatus, reference data of reference substances, and obtaining, by the MRI apparatus, measurement data of a target region of a subject. The method further includes determining, by the MRI apparatus, a reference substance of the target region, among the reference substances, and a concentration of the reference substance, using the reference data, the measurement data, and an external factor compensation value compensating for an external factor affecting the measurement data.

The magnetic resonance spectroscopic method may further include determining the external factor compensation value, using a Gaussian model.

The external factor may include at least one among characteristics of the MRI apparatus and characteristics of a specimen that is used in the obtaining the reference data.

The reference data may include spectrum information of the reference substance.

The magnetic resonance spectroscopic method may further include determining estimate data, using the reference data and the external factor compensation value, and determining minimum difference estimate data with a smallest difference from the measurement data among the estimate data. The reference substance and the concentration may be determined using the minimum difference estimate data.

The estimate data may be determined further using a reference data compensation value compensating for an error between the reference data and the measurement data.

The minimum difference estimate data may be determined using the Levenberg-Marquardt algorithm.

The estimate data may be determined further using at least one among a basis compensation value that is a weight for a basis, a reference data compensation value compensating for an error between the reference data and the measurement data, and a phase compensation value compensating for a phase difference between the estimate data and the measurement data.

The magnetic resonance spectroscopic method may further include receiving initial values of the external factor compensation value, the reference data compensation value, and the phase compensation value, determining the concentration and the basis compensation value, using the initial values, and updating the external factor compensation value, the reference data compensation value, and the phase compensation value, using the concentration and the basis compensation value.

The minimum difference estimate data may be determined by repeatedly performing the determining the concentration and the basis compensation value and the updating the external factor compensation value, the reference data compensation value, and the phase compensation value.

The concentration and the basis compensation value may minimize a difference between first estimate data that is determined based on the initial values, and the measurement data, and the updated external factor compensation value, reference data compensation value, and phase compensation value may minimize a difference between second estimate data that is determined based on the concentration and a compensation value, and the measurement data.

The estimate data may be determined using a signal model based on the reference data, the measurement data, and the external factor compensation value.

The signal model may be given by a first equation, $$\hat{Y}(v_k) = e^{-j(\phi_0 + v_k \phi_1)} \left[ \sum_{i=1}^{N_B} b_i B_i(v_k) + \sum_{l=1}^{N_M} C_l FT\{m_l(t) e^{-(\beta_l)t} e^{-\zeta t^2}\}(v_k) \right],$$

where $\hat{Y}(v_k)$ is estimate data, j is an arbitrary constant, $\phi_0$ is a zero-order phase compensation value, $\phi_1$ is a first-order compensation value, i is an index to identify a basis, $N_B$ is a number of bases, $b_i$ is a basis compensation value, $B_i(v_k)$ is a basis, $N_M$ is a number of reference substances, l is an index to identify a reference substance, $C_l$ is a concentration of a reference substance with the index l, FT( ) is Fourier transform, $m_l(t)$ is a signal model of a reference substance, $\beta_l$ is a reference data compensation value at the index l, $\zeta$ is a Gaussian damping factor, and $\upsilon_k$ is a frequency.

The minimum difference estimate data may be determined by calculating a solution to minimize a second equation, $$\|y-\phi(\alpha)c-B(\alpha)b\|_{l_2}^2+\|\lambda_B R_B b\|_{l_2}^2+\|R_p(\beta-\beta^0)\|_{l_2}^2,$$

where y is measurement data, $\phi(\alpha)$ is a part associated with a reference substance with a variable $\alpha$ in a signal model, $B(\alpha)$ is a part associated with a basis with the variable $\alpha$ in the signal model, $\alpha$ is a parameter that is determined by combining parameters used in the signal model through a variable projection, c is a concentration of a reference substance, $\lambda_B$ is a regulation factor for a basis, $R_B$ is a transform to regularize parameters of a basis $B_l(\upsilon_k)$, b is a basis compensation value, $\beta$ is a reference data compensation value, $\beta^0$ is an initial value for the reference data compensation value, and $R_p$ is a transform to regularize a difference between $\beta$ and $\beta^0$.

According to another exemplary embodiment, an MRI apparatus includes a data collector configured to obtain reference data of reference substances, and obtain measurement data of a target region of a subject. The MRI apparatus further includes a processor configured to determine a reference substance of the target region, among the reference substances, and a concentration of the reference substance, using the reference data, the measurement data, and an external factor compensation value compensating an external factor affecting the measurement data.

The processor may be further configured to determine the external factor compensation value, using a Gaussian model.

The processor may be further configured to determine estimate data, using the reference data and the external factor compensation value, and determine minimum difference estimate data with a smallest difference from the measurement data among the estimate data. The reference substance and the concentration may be determined using the minimum difference estimate data.

The processor may be further configured to receive initial values of the external factor compensation value, the reference data compensation value, and the phase compensation value, determine the concentration and the basis compensation value, using the initial values, and update the external factor compensation value, the reference data compensation value, and the phase compensation value, using the concentration and the basis compensation value.

The minimum difference estimate data may be determined by the processor repeatedly determining the concentration and the basis compensation value and updating the external factor compensation value, the reference data compensation value, and the phase compensation value.

The processor may be further configured to receive initial values of the concentration and the basis compensation value, determine the external factor compensation value, the reference data compensation value, and the phase compensation value, using the initial values, and update the concentration and the basis compensation value, using the external factor compensation value, the reference data compensation value, and the phase compensation value.

The data collector may include a magnetostatic field coil configured to generate a magnetostatic field for a subject, a gradient coil configured to generate a gradient field for the subject, and a radio frequency (RF) coil configured to apply an RF signal to the subject to which the magnetostatic field and the gradient field are generated. The data collector may be further configured to induce a magnetic resonance phenomenon in the subject, and receive a magnetic resonance signal that is generated based on the induced magnetic resonance phenomenon to obtain the reference data and the measurement data.

BRIEF DESCRIPTION OF THE DRAWINGS

The above and/or other aspects will become more apparent by describing exemplary embodiments with reference to the accompanying drawings, in which.

DETAILED DESCRIPTION

Figure 1:
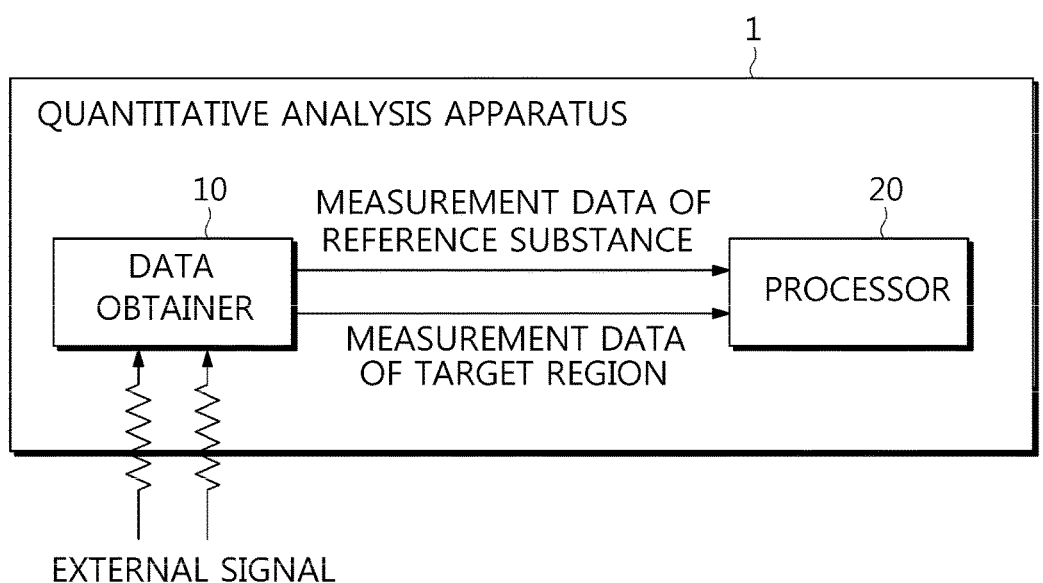
FIG. 1 is a block diagram of a quantitative analysis apparatus, according to an exemplary embodiment.

Exemplary embodiments are described in greater detail below with reference to the accompanying drawings.

In the following description, like drawing reference numerals are used for like elements, even in different drawings. The matters defined in the description, such as detailed construction and elements, are provided to assist in a comprehensive understanding of the exemplary embodiments. However, it is apparent that the exemplary embodiments may be practiced without those specifically defined matters. Also, well-known functions or constructions are not described in detail because they would obscure the description with unnecessary detail.

FIG. 1 is a block diagram of a quantitative analysis apparatus, according to an exemplary embodiment.

Referring to FIG. 1, a quantitative analysis apparatus 1 includes a data obtainer 10 and a processor 20. The data obtainer 10 and the processor 20 may be implemented in a single hardware device, or in separate hardware devices. In the latter case, for example, the data obtainer 10 may be implemented in a main body of a magnetic resonance imaging (MRI) apparatus, and the processor 20 may be implemented in a workstation that may communicate with the main body via a cable or wirelessly.

The data obtainer 10 obtains measurement data of a subject by collecting signals sent from outside or at least one external signal. The signals sent from outside may include at least one of visible rays, infrared rays, ultrasounds, radioactive rays, radio frequency (RF) pulses, and magnetic resonance signals. The signals may be magnetic resonance signals reflected from or penetrating the subject, or induced from inside the subject by a magnetic field and RF pulses.

The subject may include not only a living thing such as a human being, an animal, etc., but also lifeless things. It may also be a specimen or metabolite. In other words, the data obtainer 10 may obtain measurement data from a specimen or metabolite. A metabolite is produced due to a change in substance inside a living thing. The metabolite may have a type of the living thing itself, or have any type depending on a region inside the living thing where the substance is produced.

The subject may be an object subject to quantitative analysis. There may be a target region inside the subject, which corresponds to at least one part of the subject to the quantitative analysis. For example, if the subject is a human body, the target region may be an internal organ such as the brain, heart, or lungs. The subject may also be a reference substance. The reference substance refers to a substance used as a reference in quantitative analysis. The reference substance may be an individual constituent of the target region for quantitative analysis. If the subject is a living thing such as a human body or an animal, the reference substance may be a metabolite as described above.

The data obtainer 10 may obtain measurement data by collecting magnetic resonance signals that is reflected from or penetrating the subject, or induced from inside the subject. The data obtainer 10 may include a signal collector for collecting various signals from the subject. For example, the data obtainer 10 may include a visible ray detector, an ultrasonic transducer, a radiation detector, or an RF coil. The RF coil as herein used may be a receive coil or a transceive coil. The data obtainer 10 may irradiate visible rays, ultrasounds, or radioactive rays or apply magnetic fields or RF pulses to the subject, to collect various signals from the subject. For this, the data obtainer 10 may include a light source, an ultrasonic transducer, a radiation source, or an RF coil. The RF coil as herein used may be a transmit coil or a transceive coil.

The measurement data is derived from visible rays, infrared rays, ultrasounds, radioactive rays, RF pulses, or magnetic resonance signals to have a form to perform data processing, such as image processing. The measurement data may be implemented in the form of an electric signal that may be a digital signal or an analog signal. The measurement data may be represented in a spectral form.

The data obtainer 10 may collect measurement data for the subject multiple times. In this case, the data obtainer 10 may collect measurement data for a different subject each time. For example, the data obtainer 10 may collect measurement data for a plurality of reference substances, or for a target region subject to quantitative analysis. Such data obtainment may be performed at different points of time.

The data obtainer 10 may forward the obtained data to the processor 20. The data obtainer 10 may forward respective measurement data of the reference substance and target region to the processor 20.

The data obtainer 10 may communicate with the processor 20 via an electric circuit or cable, or over a wireless communication network. The wireless communication network may include a short-range wireless communication network implemented by various short-range communication technologies, such as Bluetooth, Bluetooth low energy, Infrared Data Association (IrDA), Wireless Fidelity (Wi-Fi), Wi-Fi Direct, Ultra Wideband (UWB), Zigbee, or Near Field Communication (NFC), and/or a mobile communication network using 3GPP series, 3GPP2 series, or IEEE series wireless communication technologies, such as Code Division Multiple Access (CDMA), WiBro, High Speed Packet Access+(HSPA+), Long-Term Evolution (LTE), etc.

The processor 20 performs quantitative analysis with the data obtained by the data obtainer 10.

Measurement data of a reference substance and measurement data of a target region will now be described in more detail.

Figure 2:
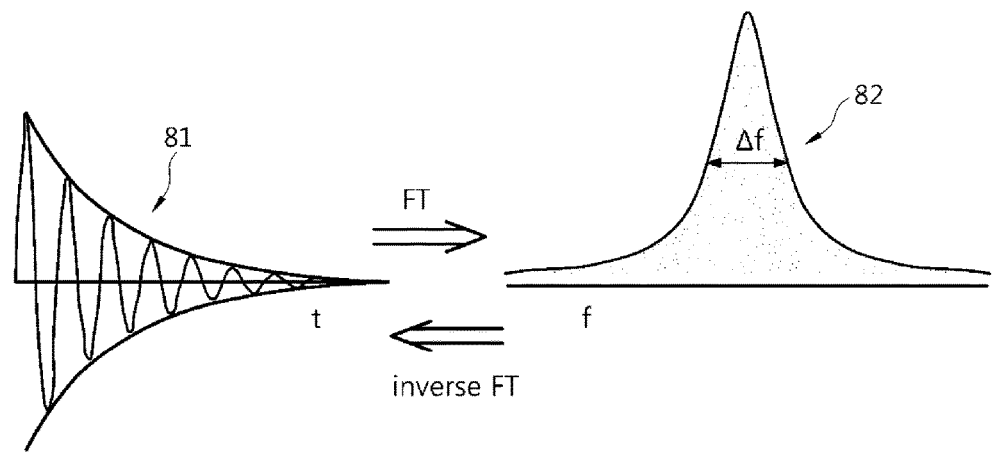
FIG. 2 is a diagram illustrating time and frequency domains.

FIG. 2 is a diagram illustrating time and frequency domains.

In FIG. 2, a signal 81 represented in the time (t) domain and a signal 82 represented in the frequency (f) domain are shown. In the time domain, the signal 81 is represented on the x-axis of time and the y-axis of signal strength. Thus, in the time domain, changes in the signal 81 may be represented over time. In the frequency domain, the signal 82 is represented on the x-axis of frequency and the y-axis of signal strength. As the frequency domain may represent the signals at different frequencies, a signal 82 of multiple frequencies may be represented. A signal represented in the time domain may be Fourier transformed into the frequency domain. Conversely, a signal represented in the frequency domain may be inverse Fourier transformed (FT) into the time domain. Thus, the same signal may be differently represented in the time domain and frequency domain.

In an exemplary embodiment where the quantitative analysis apparatus 1 is an MRI apparatus, if RF pulses are applied to a metabolite that is put under a magnetostatic field and a gradient field, the data obtainer 10 may collect an FID signal from the metabolite that has the same form as or similar form to the signal 81 in the time domain of FIG. 2. The FID signal may be forwarded to the processor 20.

Figure 3:
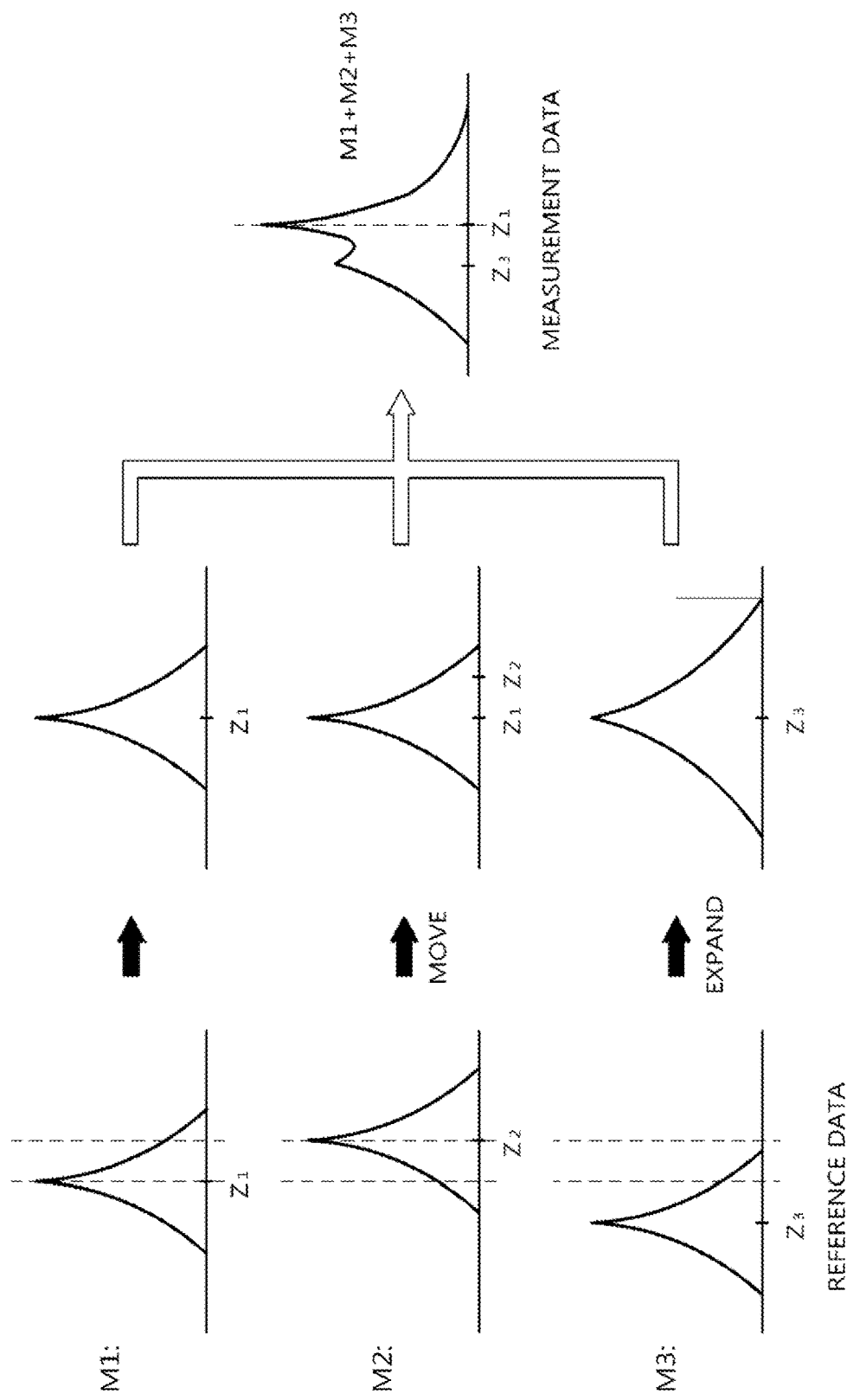
FIG. 3 is a diagram illustrating measurement data of reference substances and measurement data of a target region, according to an exemplary embodiment.

FIG. 3 is a diagram illustrating measurement data of reference substances and measurement data of a target region, according to an exemplary embodiment.

Referring to FIG. 3, measurement data M1, M2, and M3 of reference substances may be represented in at least one spectrum of the frequency domain. The measurement data M1, M2, and M3 may be obtained for multiple reference substances. The measurement data M1, M2, and M3 obtained for the multiple reference substances may have different frequencies Z1, Z2, and Z3, or different strengths, depending on the type of the respective reference substances.

In such a case that the measurement data M1, M2, and M3 of the reference substances are represented in the spectral form, measurement data M of a target region may be represented in a linear combination of the measurement data M1, M2, and M3 of the at least one reference substance, as shown in FIG. 3. Frequencies Z1, Z2, and Z3 of the measurement data M1, M2, and M3 may be different from each other. Depending on the concentration of the reference substance within the target region, a portion that each reference substance accounts for in the linear combination may be determined. The measurement data M1, M2, and M3 of the reference substances may just be linearly combined into the measurement data M for the target region, but some frequencies of the spectrum of the measurement data may be shifted or broadening.

For example, as shown in FIG. 3, the spectrum of each reference substance, such as the spectrum M1 of the first substance may be combined with the spectra M2, M3 of the other reference substances without shifting, or the spectrum of each reference substance, such as the spectrum M2 of the second substance may be combined with the spectra M1, M3 of the other reference substances after the second frequency Z2 is shifted or moved to the first frequency Z1 in the spectrum M2, depending on the substance in the target region of the subject, or the spectrum of each reference substance, such as the spectrum M3 of the third substance may be combined with the spectra M1, M2 of the other reference substances after the spectrum M3 of the third substance is expanded or reduced. Accordingly, the measurement data M measured from the target region may be a linear combination of the spectra M1 to M3 of the reference substances after the spectrum of a reference substance is shifted to an extent, as shown in FIG. 3.

Figure 4:
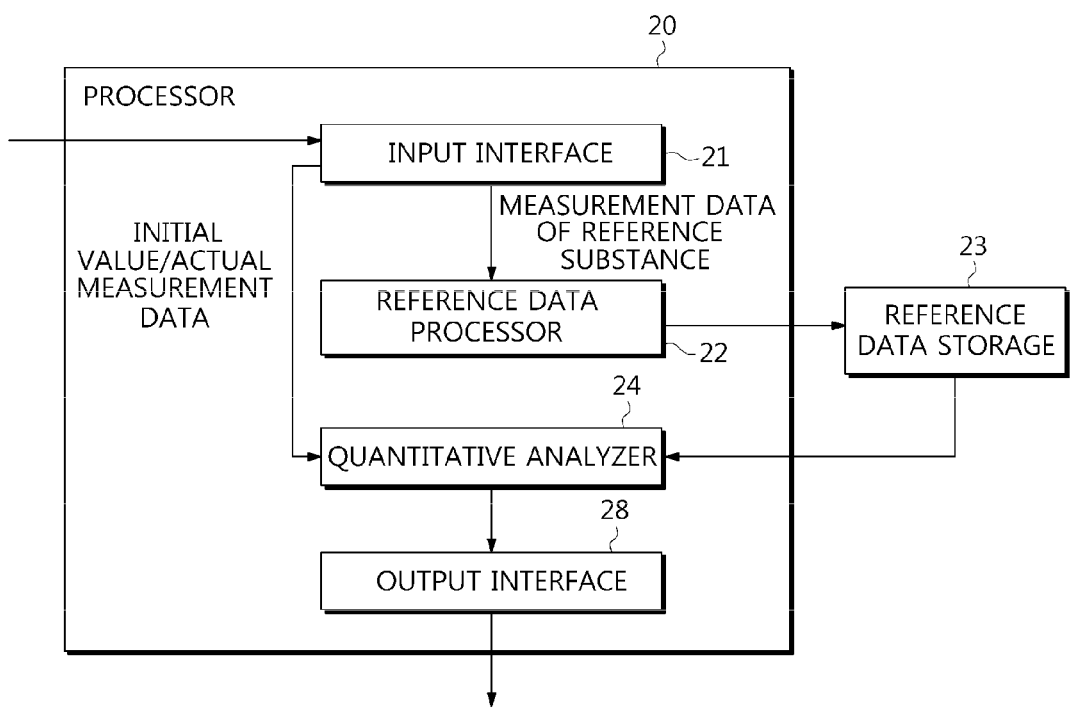
FIG. 4 is a detailed block diagram of a processor, according to an exemplary embodiment.

FIG. 4 is a detailed block diagram of a processor, according to an exemplary embodiment.

Referring to FIG. 4, the processor 20 includes an input interface 21, a reference data processor 22, a quantitative analyzer 24, and an output interface 28.

The input interface 21, reference data processor 22, quantitative analyzer 24, and output interface 28 may be physically or logically separated from one another. Alternatively, some of them may be physically separated, and some others may be logically separated. For example, the input interface 21 and output interface 28 may be implemented by separate circuits, and the reference data processor 22 and quantitative analyzer 24 may be implemented by at least one semiconductor chip and various parts to support operation of the semiconductor chip, e.g., cache memories. To implement the reference data processor 22 and quantitative analyzer 24, the at least one semiconductor chip may be separately programmed.

The input interface 21 receives measurement data of a reference substance or of a target region sent from the data obtainer 10. The input interface 21 may even receive initial values to be used by the quantitative analyzer 24. The initial value may be input to the input interface 21 through a separate input interface, e.g., a keyboard by the user's manipulation. In an exemplary embodiment, the input interface 21 may be implemented by a wired or wireless communication interface. The wired communication interface may include a cable connection terminal, a socket, and various components associated with them, and the wireless communication interface may include an antenna, a communication chip, and various components associated with them.

As shown in FIG. 4, the input interface 21 may forward the measurement data of the reference substance to the reference data processor 22, and forward the actual measurement data of the target region to the quantitative analyzer 24. For this, the input interface 21 may further include a component such as a switching element.

The reference data processor 22 obtains reference data based on the measurement data of a reference substance. The reference data processor 22 may obtain the reference data by using a predefined algorithm. The reference data may correspond to the measurement data of the reference substance, or what is obtained by modifying the measurement data of the reference substance to have a form for quantitative analysis, e.g., a form of a signal model. The reference data may be stored in the form of a signal model. In this case, the reference data may be represented in the form of a function.

In an exemplary embodiment, the reference data may be represented in the time domain or the frequency domain. The reference data processor 22 may obtain reference data of the reference substance by amplifying or performing analog to digital conversion on the measurement data of the reference substance. Furthermore, the reference data processor 22 may obtain spectrum information in the frequency domain for the metabolite by performing Fourier transform on the signal in the time domain.

For example, in an exemplary embodiment where the quantitative analysis apparatus 1 corresponds to an MRI apparatus, the reference data processor 22 of the processor 20 may determine an FDI signal obtained from the reference substance as the reference data. In this case, the reference data may be represented in the time domain. In an exemplary embodiment, the reference data processor 22 may obtain the spectrum information in the frequency domain by performing Fourier transform on the obtained FID signal, and determine the spectrum information as the reference data.

Referring to FIG. 4, the reference data processor 22 may store the obtained reference data in a reference data storage 23. The reference data processor 22 may store the reference data in the reference data storage 23 by classifying them by the type of reference substance, the type of target region, and the type or identification number of the quantitative analysis apparatus 1. For example, in a case that the reference substance is a metabolite produced by biological activities of the brain, the reference data processor 22 may store the obtained reference data in the reference data storage 23 by categorizing them as brain-related reference data. In this case, an associated identification symbol may be attached to the header of the reference data. The reference data processor 22 may build a reference substance database in the reference data storage 23 based on the reference data. In one or more exemplary embodiments, another quantitative analysis apparatus in addition to the quantitative analysis apparatus that obtains the reference data may also use the information about the reference substance stored in the reference data storage 23.

The reference data storage 23 may be implemented by a magnetic disk recording device, a magnetic tape recording device, an optical disk recording device, or a semiconductor recording device. The reference data storage 23 may be implemented by a storage device embedded in the quantitative analysis apparatus 1, or by a separate storage device that is located outside the quantitative analysis apparatus 1 and able to communicate with the quantitative analysis apparatus 1.

The quantitative analyzer 24 receives measurement data of a target region from the input interface 21, and performs quantitative analysis on the measurement data. The quantitative analysis as herein used refers to analyzing how much concentration a substance has in the measurement data. In other words, it refers to analyzing quantitative relations between substances that exist in the target region.

In an exemplary embodiment, the quantitative analyzer 24 may select at least one piece of reference data from pieces of reference data stored in the reference data storage 23, and obtain reference data that matches the measurement data obtained from the target region, its concentration, and any combination of the selected pieces of reference data.

In an exemplary embodiment, the quantitative analyzer 24 may obtain reference data and the concentration of the reference data, using estimate data that best matches the measurement data of the target region. The quantitative analyzer 24 may further obtain any combination of pieces of reference data. The estimate data as herein used refers to data to be compared with the measurement data of the target region in determining the measurement data of the target region. The estimate data may be obtained using reference data of the reference substance. For example, the estimate data may be obtained from reference data of a reference substance that is expected to be present in the target region, a concentration of the reference substance, and a combination of pieces of reference data for multiple reference substances. The estimate data that best matches the measurement data of the target region may be one of the pieces of estimate data that minimizes the difference from the measurement data of the target region. Hereinafter, the estimate data that minimizes the difference from the measurement data of the target region is referred to as minimum difference estimate data. In an exemplary embodiment, the quantitative analyzer 24 may or may not obtain the minimum difference estimate data in the process of obtaining the reference data and the concentration of the reference data.

In an exemplary embodiment, the quantitative analyzer 24 may determine the estimate data by using or assuming at least one signal model that may be determined based on the reference data. The signal model refers to a model that embodies, e.g., the form of a changing electric signal in the time domain or frequency domain, using various parameters and mathematical expressions. If the measurement data of the target region has a spectral form as shown in FIG. 3, the quantitative analyzer 24 may perform curve fitting between the measurement data of the target region and the signal model, to determine the minimum difference estimate data. The quantitative analyzer 24 may perform quantitative analysis on the target region in the subject, using the curve fitting result between the measurement data of the target region and the signal model.

To help understanding operation of the quantitative analyzer 24, the concept of quantitative analysis method that may be performed by the quantitative analyzer 24 will be described first.

Figure 5:
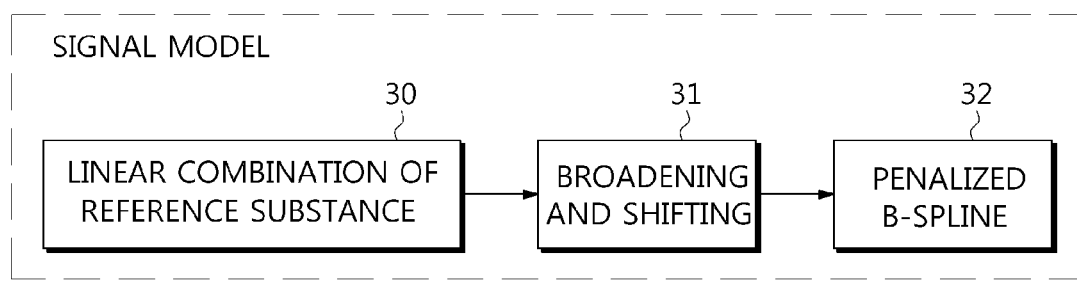
FIG. 5 is a diagram illustrating a conceptual procedure of obtaining a signal model, according to an exemplary embodiment.

FIG. 5 is a diagram illustrating a conceptual procedure of obtaining a signal model, according to an exemplary embodiment.

For quantitative analysis on the measurement data measured from the target region based on the reference data M1 to M3, at least one signal model embodied based on the reference data may be determined, and a method that compares the determined signal model with the measurement data of the target region may be used.

In this case, the signal model may be obtained through penalized B-spline (or P-spline) modeling 32 based on assumptions that the measurement data M is a linear combination 30 of reference data M1 to M3, the spectrum of at least one reference substance, and the respective spectra M1 to M3 are broadened (M3) and shifted (M2) 31, as shown in FIG. 5.

B-spline refers to a spline function to form a B-spline curve using data for fitting. The B-spline curve corresponds to a curve formed not to pass given multiple points but pass close by the points. B-spline may include at least one of quadratic B-spline and cubic B-spline. The penalized B-spline refers to a B-spline function that determines parameters by further using a penalty function that emphasizes smoothness to prevent overfitting.

The measurement data obtained by the quantitative analysis apparatus 1 may be affected by external factors, such as characteristics of the quantitative analysis apparatus or characteristics of a specimen used in obtaining the reference data, e.g., a specimen of a metabolite. For example, some quantitative analysis apparatuses may produce inhomogeneous fields or eddy currents. In other words, ideal measurement data of a target region may be different from actual measurement data of the target region due to various external factors as described above. For example, as for an FID signal in MRI scanning, it may be damping more quickly or smoothly than expected, depending on the characteristics of the MRI apparatus.

Accordingly, in determining a signal model to be compared with and fitted to measurement data of the target region, an apparatus for compensating for the external factor that affects the measurement data may further be reflected. That is, a signal model may be determined by reflecting an external factor contained in the measurement data. To reflect the external factor, the signal model may be determined to further include an external factor compensation value to compensate for the external factor.

In an exemplary embodiment, a Gaussian model may be used to reflect and compensate for the external factor. The Gaussian model may be used to form a signal model in a form that adds a mathematical term (or mathematical formula) like $e^{-\xi t^2}$ to the signal model represented in the time domain. In other words, it may be seen that the Gaussian model transforms an original signal model with $e^{-\xi t^2}$. With $e^{-\xi t^2}$ applied to the signal model in the Gaussian model, the signal model may have a form in which, for example, as it is farther from the original point, it is constantly damping. The form of the signal model may be determined by parameter applied to the exponential term $e^{-\xi t^2}$. Hereinafter, $\zeta$ of the exponential term that may change the form of the signal model formed in the Gaussian model may be called a Gaussian damping factor. The signal model may be changed differently, depending on what value the Gaussian damping factor has. For example, a signal model having cosine waveforms in the time domain may be damping more quickly or smoothly, depending on the value of the Gaussian damping factor. Accordingly, if a proper Gaussian damping factor is determined, the Gaussian model may be able to compensate for an error due to an external factor.

Furthermore, the signal model may be formed by reflecting an additional value for compensating the reference data.

The value for compensating the reference data may include a reference data compensation value. The reference data compensation value may include an error compensation value to compensate for a small error that may occur in applying the reference data. If the MRI apparatus is used as the quantitative analysis apparatus 1, the reference data compensation value may further include a T2 time compensation value to compensate for reduction in T2 time that represents a period of collapse of magnetization components. In addition, the reference data compensation value may include various compensation values to compensate the reference data.

Furthermore, in determining a signal model, a basis may further be reflected for the signal model. The term 'basis' as herein used refers to a reference to represent a signal. For example, the basis may be the x-axis of FIGS. 2 and 3. The basis may also be expressed in a vector or matrix form. In addition, various references may be used as the basis in processing the signal model. There may be multiple bases. Adding the basis to the signal model enables the signal model to be more properly fitted to the measurement signal of the target region. A base compensation value may further be added to each basis reflected for the signal model. The basis compensation value may be a weight for each basis.

Moreover, in the case of determining a signal model, a phase compensation value may further be reflected for the signal model to compensate for a phase difference between the measurement signal of the target region and the signal model. In this case, multiple phase compensation values may be reflected for the signal model, depending on the order of the phase. In one or more exemplary embodiments, the phase compensation value may include a zero-order phase compensation value for compensating for the zero-order phase, and a first-order phase compensation value for compensating for the first-order phase.

In such a case where the Gaussian model and various compensation values are reflected, the signal model may be given as the following equation 1:

$$\hat{Y}(v_k) = e^{-j(\phi_0 + v_k \phi_1)} \left[ \sum_{i=1}^{N_b} b_i B_i(v_k) + \sum_{l=1}^{N_M} C_l FT\{m_l(t) e^{-(\beta_l)t} e^{-\zeta t^2}\}(v_k) \right] \quad (1)$$

In equation 1, $\hat{Y}(v_k)$ is estimate data, j is an arbitrary constant, $\phi_0$ is a zero-order phase compensation value, $\phi_1$ is a first-order compensation value, i is an index to identify a basis, $N_B$ is a number of bases, $b_i$ is a basis compensation value, $B_i(v_k)$ is a basis, $N_M$ is a number of reference substances, l is an index to identify a reference substance, $C_l$ is a concentration of a reference substance with the index l, FT( ) is Fourier transform, $m_l(t)$ is a signal model of a reference substance, $\beta_l$ is a reference data compensation value at the index l, $\zeta$ is a Gaussian damping factor, and $v_k$ is a frequency.

In detail, $\hat{Y}(v_k)$ of the left side refers to estimate data to be compared with the measurement data of the target region. The estimate data may be represented in a signal model of the right side. $v_k$ indicates a frequency. In other words, $\hat{Y}(v_k)$ of the left side may be given as a dependent variable with an independent variable of frequency.

In the signal model, $e^{-j(\phi_0 + v_k \phi_1)}$ of the left side is a factor for changing the phase of the signal model, where j is a constant, $\phi_0$ is a zero-order phase compensation value and $\phi_1$ is a first-order phase compensation value. These are used to compensate for the phase difference between the signal model and the measurement data of the target region as described above.

In the bracket ([ ]), $\Sigma bB(v)$ is a mathematical expression for reflecting the basis of the signal model, and $\Sigma C_l FT\{m(t)e^{-\beta t}e^{-\xi t^2}\}(v)$ is a mathematical expression for reflecting a linear combination of reference substances.

For $\Sigma bB(v)$, i indicates an index to identify a corresponding basis $B_i(vk)$ among multiple bases, and $N_B$ indicates the number of the bases. $B_i(vk)$ refers to the basis. $B_i$ refers to the basis compensation value, which is a weight for the basis. The basis $B_i(vk)$ may include the cubic B-spline or quadratic B-spline. $b_i$ may have a value of 0. If $b_i$ is 0 for index $i_l$, this describes that the basis $B_{il}(vk)$ with the index $i_l$ is not used in the current signal model. The number of bases $N_B$ may be pre-determined by the system designer or the user.

Moreover, in $\Sigma C_l FT\{m(t)e^{-\beta t}e^{-\xi t^2}\}(v)$, 1 is an index to identify the reference substance, and $N_M$ is a total number of reference substances. The number of reference substances $N_M$ refers to the number of reference substances to be used in determining the signal model. The number of reference substances $N_M$ may be determined by a predetermined setting. The number of reference substances $N_M$ may be determined depending on a target region from which the measurement data is obtained. For example, in a case of performing quantitative analysis on a metabolite in the brain with the MRI apparatus, the number of reference substances $N_M$ may be determined to correspond to the number of metabolites that may exist in the brain. For example, the number of reference substances $N_M$ may be determined to be sixteen.

In $\Sigma C_l FT\{m(t)e^{-\beta t}e^{-\xi t^2}\}(v)$, $C_l$ refers to concentration of a reference substance with index l. In other words, $C_l$ represents what amount the reference substance with index l has in the signal model. If an appropriate signal model is obtained for the measurement data of the target region, $C_l$ of the signal model may refer to a concentration estimated for the reference substance with the index l in the target region. The greater the $C_l$, the more the reference substance with the index l estimated to be present in the target region; and the smaller the $C_l$, the less the reference substance with the index l estimated to be present in the target region. The $C_l$ may also be 0. If $C_{1l}$ is 0 for index $1_l$, it describes that a substance of the index $1_l$ is estimated not to be present in the target region at all.

$FT\{A\}(v)$ refers to Fourier transform on a function A represented in the time domain into the frequency domain.

$m_i(t)$ in $FT\{\ \}$ refers to reference data. $m_i(t)$ may correspond to a signal model of the reference substance itself, in which case the signal model may be represented in the time domain with an independent variable of time as shown in FIG. 3. $\beta l$ refers to the reference data compensation value for index l. As described above, the reference data compensation value may refer to a value for compensating for an error of the reference data and/or reduction in T2 time.

$\zeta$ is a Gaussian damping factor for compensating for an external factor. As described above, the Gaussian damping factor may determine the form of a signal model that uses a Gaussian model, and once a proper Gaussian damping factor is determined, an error that occurs due to an external factor may be compensated for.

For equation 1, the reference data compensation value $e^{-\beta t}$ to compensate the reference data and a Gaussian model $e^{-\xi t^2}$ to compensate for an external factor may be reflected in the reference data $m_i(t)$. If the MRI apparatus is used to collect data from a reference substance or a subject, the reference substance may be represented by a signal model, as shown in the left of FIG. 3. In this case, the reference data compensation value $e^{-\beta t}$ and the Gaussian model $e^{-\xi t^2}$ may be reflected in the reference data $m_i(t)$ of the reference substance by multiplying the reference data compensation value $e^{-\beta t}$ and the Gaussian model $e^{-\xi t^2}$ to the signal model of the substance model $m_i(t)$ itself.

As the reference data $m_i(t)$ is represented in the time domain, Fourier transform may be used to transform the reference data $m_i(t)$ into the frequency domain. A spectrum for the reference data with the compensation value applied may be provided, and the shape of the spectrum may be similar to that of the measurement data of the reference substance as shown in FIG. 3.

Referring to mathematical expression $\Sigma C_l FT\{m(t)e^{-\beta t} e^{-\xi t^2}\}(v)$, the respective spectra for pieces of reference data may be weighted-summed with predetermined weights $C_l$. As described above, the weight $C_l$ refers to concentration of a reference substance that corresponds to the reference data. Accordingly, after curve fitting is completed, whether or not a reference substance exists and concentration of the reference substance in the target region may be determined through estimation, based on the weight $C_l$.

The signal model may reflect the basis through a mathematical term $\Sigma bB(v)$.

The signal model may reflect the basis and reference data with a compensation value applied, by combining mathematical terms $\Sigma bB(v)$ and $\Sigma C_l FT\{m(t)e^{-\beta t} e^{-\xi t^2}\}(v)$.

In the meantime, to further compensate for a phase of the signal model, a phase compensation value $e^{-(\varphi_0 + v_k \varphi_l)}$ may be multiplied to the combination of $\Sigma bB(v)$ and $\Sigma C_l FT\{m(t)e^{-\beta t} e^{-\xi t^2}\}(v)$.

Accordingly, a signal model that reflects the basis, reference data compensation value, Gaussian damping factor, and phase compensation value may be obtained.

With the signal model, values of variables in the signal model may be determined such that the signal model corresponds or approximates to the measurement data of the target region within a predetermined margin of error. In this case, the values of variables may include a zero-order phase compensation value $\varphi_0$, a first-order phase compensation value $\varphi_l$, a reference data compensation value $\beta_1$, and a Gaussian damping factor $\zeta$.

The values of the variables in the signal model may be determined in various methods. A value of each variable of the signal model may be obtained using at least one curve fitting algorithm. With the at least one curve fitting algorithm, estimate data for the measurement data of the target region may be obtained. A signal model that corresponds or approximates to spectrum information, which is the measurement data obtained from the target region within a predetermined margin of error may be obtained, and accordingly, respective values of the variables in the signal model may be determined as well.

In an exemplary embodiment, curve fitting may be performed using the least square method, such as a non-linear least square method to minimize an error between the estimate data and measurement data of the target region. In other words, curve fitting may be performed by obtaining a non-linear least square solution between the estimate data and measurement data of the target region.

Curve fitting may be performed in an iterative method as well.

As an exemplary embodiment of the curve fitting method, the Levenberg-Marquardt algorithm will now be described.

Figure 6:
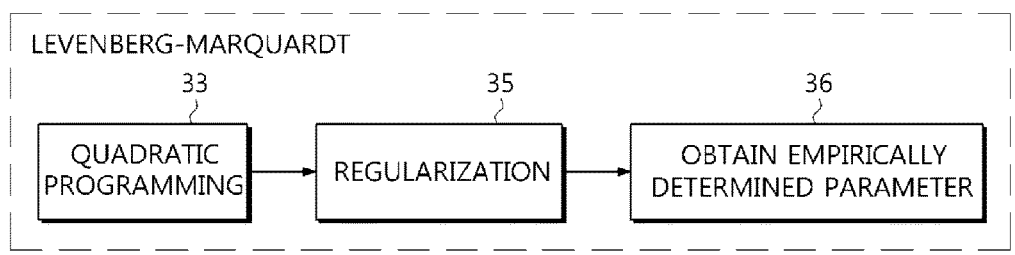
FIG. 6 is a diagram illustrating the Levenberg-Marquardt algorithm in curve fitting, according to an exemplary embodiment.
Figure 7:
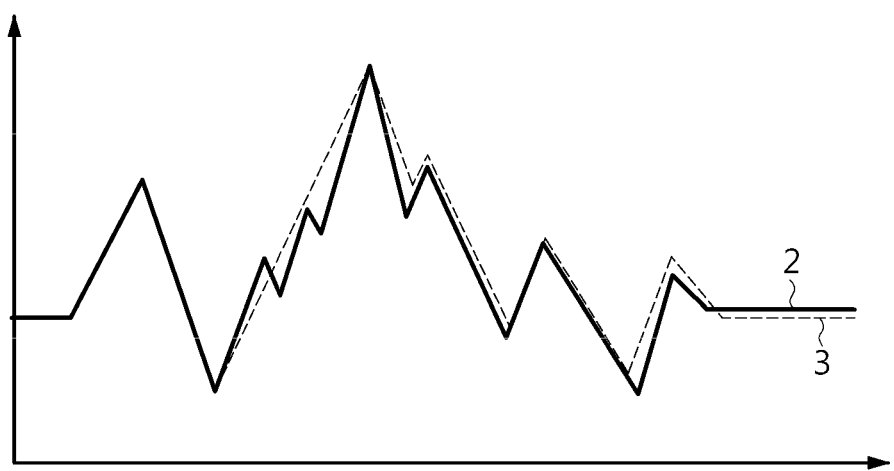
FIG. 7 is a diagram illustrating curve fitting results of FIG. 6.

FIG. 6 is a diagram illustrating the Levenberg-Marquardt algorithm in curve fitting, according to an exemplary embodiment, and FIG. 7 is a diagram illustrating curve fitting results of FIG. 6.

The Levenberg-Marquardt algorithm is used to solve non-linear least squares problems, and also called a Damped Least Squares (DLS) method. Given a pair of empirical data sets of a number of independent and dependent variables, the Levenberg-Marquardt algorithm refers to an algorithm to optimize unknown parameters so that the sum of the squares of the deviations between the function of the independent variable and the unknown parameter and the dependent variable becomes minimal.

To perform curve fitting using the Levenberg-Marquardt algorithm, an optimization equation may be provided first, according to quadratic programming (or non-linear programming), in block 33. The quadratic programming refers to a conditional maximization problem with an objective function that is a quadratic function and constraints of linear equalities or inequalities. Many different types of quadratic programming that are ordinarily used may be used herein.

Given the equation as described above, regularization may further be performed to regulate the solution to be obtained, in block 35. The regularization refers to regulating the solution by adding another assumption to the original problem, to solve a problem having poor conditions.

With the procedures of the quadratic programming (33) and regularization (35), a final parameter empirically determined may be obtained, in block 36. Optimized estimate data may be obtained for the measurement data of the target region based on the obtained parameter.

In the meantime, to determine respective values of the variables in the signal model, two or more of the multiple variables in the signal model may be merged into a new variable, which, in turn, may be used to perform curve fitting, thereby obtaining the respective values of the variables. Such a method is referred to as Variable Projection (VARPRO). According to the VARPRO, two or more variables may be simultaneously determined to minimize the difference between the signal model and the measurement data.

In case of using the Levenberg-Marquardt algorithm, curve fitting may be performed through a procedure of obtaining a solution that minimizes the following equation 2:

$$\sum_{k=1}^{N} \left\{ Re[Y(v_k) - \hat{Y}(v_k)] \right\}^2 + \|\lambda_B R_b b\|_{l_2}^2 + \sum_{l=1}^{N_M} \left\{ \frac{[\gamma_l - \gamma_l^0]^2}{\sigma^2(\gamma_l)} + \frac{\varepsilon_l^2}{\sigma^2(\varepsilon_l)} \right\} \quad (2)$$

In equation 2, $Y(vk)$ is measurement data of the target region, $\hat{Y}(vk)$ is estimate data, $Y(vk)$ is minimum difference estimate data that minimizes the difference between the measurement data $Y(vk)$ and the estimate data $\hat{Y}(vk)$.

$\|\|$ refers to a norm, and $l_2$ below the $\|\|$ refers to $l_2$-norm. The $l_2$-norm refers to obtaining a square root of a sum of squares of respective elements.

The first expression of the equation 2, $\|Re[Y(vk) - \hat{Y}(vk)]\|^2$, is provided according to the quadratic programming, in block 33. $Re[A]$ is a symbol that refers to a real number part of A.

In the second expression $\|\lambda R_B b\|^2$, $\lambda B$ is a regularization factor for the basis $B_i(vk)$, and $R_B$ is transform for regularization of the parameters of the basis $B_i(vk)$. $R_B$ may be a second-order difference of the B-spline parameter. b is a basis compensation value.

The third expression is a formula to process the reference data compensation value, in a case where compensation for an error of the reference data and T2 time reduction, as an example of the reference data compensation value, is performed. In the third expression, $\gamma$ is a value for compensating for the T2 time reduction, and c is a value for compensating for the error of the reference data.

The equation 2 may be represented in a matrix form as in the following equation 3.

$$\|y-\phi(\alpha)c-B(\alpha)b\|_{l_2}^2+\|\lambda_B R_B b\|_{l_2}^2+\|R_p(\beta-\beta^0)\|_{l_2}^2 \qquad (3)$$

In equation 3, y is measurement data, $\phi(\alpha)$ is a part associated with a reference substance with a variable $\alpha$ in a signal model, $B(\alpha)$ is a part associated with a basis with the variable $\alpha$ in the signal model, $\alpha$ is a parameter that is determined by combining parameters used in the signal model through a variable projection, c is a concentration of a reference substance, $\lambda_B$ is a regulation factor for a basis, $R_B$ is a transform to regularize parameters of a basis $B_i(v_k)$, b is a basis compensation value, $\beta$ is a reference data compensation value, $\beta^0$ is an initial value for the reference data compensation value, and $R_p$ is a transform to regularize a difference between $\beta$ and $\beta^0$.

In detail, y indicates measurement data, and $\varphi(\alpha)$ indicates a part associated with a reference substance with variable $\alpha$. $\alpha$ is a non-linear parameter obtained by combining parameters used in the signal model through variable projection. Here, the obtained non-linear parameter $\alpha$ may be obtained by combining other values than the number of bases b and concentration of the reference substance c. In other words, the non-linear parameter $\alpha$ may be obtained by combining the phase compensation value, the Gaussian damping factor, and the reference data compensation value. This may be represented in $\alpha=[\varphi_1, \varphi_2, \zeta, \gamma_1, \ldots, \beta_{NM}, \varepsilon_l, \ldots, \varepsilon_{NM}]^T$.

The reference data compensation value may include a value for compensating for an error of the reference data and/or T2 time reduction. $B(\alpha)$ refers to a part associated with a basis having variable $\alpha$. b refers to the number of bases, and c refers to concentration of the reference substance.

The first expression of the equation 3 is provided based on the aforementioned quadratic programming (33).

The second expression $\|\lambda R_B b\|^2$ the same as what is shown in the equation 2.

In the third expression $\|Rp(\beta-\beta 0)\|^2$, Rp is transform for regularization of a difference between $\beta$ and $\beta 0$. $\beta$ is the reference data compensation value, and $\beta 0$ refers to an initial value of the reference data compensation value. The initial value of the reference data compensation value may be any value. The reference data compensation value $\beta$ may include a value for compensating for an error of the reference data and/or T2 time reduction. If the reference data compensation value contains the value for compensating for the error of the reference data and/or T2 time reduction, $\beta$ may be given as $\beta=[\gamma_l, \ldots, \gamma_{NM}, \varepsilon_l, \ldots, \varepsilon_{NM}]^T$.

To minimize the equation 3, an iterative method may be used.

According to the iterative method, some of a plurality of parameters in the equation may first be obtained, and subsequently, procedures of obtaining the other parameters may be repeatedly performed. Some of the plurality of parameters (first parameters) in the equation are treated as constants while some other of the plurality of parameters (second parameters) are treated as variables, and thus, values of the second parameters to minimize the equation under the condition where the first parameters are constants may be obtained. In this case, values of the second parameters to minimize the equation may be obtained through convex optimization. Once values of the second parameters are obtained, the existing second parameters are updated by being replaced with the obtained values of the second parameters, and then values of the first parameters to minimize the equation may be obtained by treating the updated second parameters as constants while treating the first parameters as variables. Once values of the first parameters are obtained again, the existing first parameters are updated by being replaced with the obtained values of the first parameters, and then values of the second parameters to minimize the equation may be obtained again by treating the updated first parameters as constants while treating the second parameters as variables. With the procedure repeatedly performed more than predetermined number of times, the first and second parameters to minimize the equation within a range set by the user may be obtained. Considering characteristics of the apparatus, computing time, etc., the first and second parameters may not be what perfectly minimize the equation. In this case, the procedure may be repeated as many as the determined number of times selected by the user or system designer, and consequently, the first and second parameters may be obtained to minimize the equation within the number of iterations. Furthermore, with repetition of the procedure until the resultant value of solving the equation becomes smaller than a predetermined value selected by the user or system designer, the first and second parameters that make the results of the equation smaller than a value may be obtained.

To obtain values of the parameters to minimize the equation 3 with the iterative method, $\alpha$ and $\beta$, which are parameters obtained by combining the parameters used in the signal model, is treated as constants with arbitrary initial values first while the number of bases b and concentration of the reference substance c of the equation 3 are treated as variables of the equation 3, and number of bases b1 and concentration of the reference substance c1 to minimize the equation 3 may then be obtained. Subsequently, after the obtained number of bases b1 and concentration of the reference substance c1 are substituted in the equation 3, the number of bases b1 and concentration of the reference substance c1 are treated as constants while $\alpha$ and $\beta$ are treated as variables, and $\alpha 1$ and $\beta 1$ to minimize the equation 3 may be obtained. Again, after the obtained $\alpha 1$ and $\beta 1$ are substituted for $\alpha$ and $\beta$, respectively, $\alpha$ and $\beta$ are treated as constants while the number of bases b1 and concentration of the reference substance c are treated as variables, and in turn, the number of bases b2 and concentration of the reference substance c2 to minimize the equation 3 may be obtained. Appropriate $\alpha$, $\beta$, the number of bases b, and concentration of the reference substance c may be obtained by repeating the procedure until the equation 3 becomes small to an extent, or as many as a predetermined number of times. As described above, because $\alpha$, $\beta$, the number of bases b, and concentration of the reference substance c are made up of the parameters in the signal model expressed in the equation 1, estimate data 3 corresponding to measurement data 2 of the target region may be finally obtained as shown in FIG. 7. The obtained estimate data 3 may be the same as, or approximate to the measurement data 2 of the target region.

As expressed in equation 1, because the estimate data includes information about a type and concentration of the reference substance, a type and concentration of the reference substance that corresponds to a metabolite in the target region may consequently be obtained. Accordingly, quantitative analysis on the target region may be performed.

In one or more exemplary embodiments, after $\alpha$ and $\beta$ to minimize the equation 3 are obtained with the number of bases b and concentration of the reference substance c treated as constants by substituting them with initial values, the number of bases b and concentration of the reference substance c to minimize the equation 3 may be obtained first, and finally, estimate data corresponding to the measurement data of the target region may be obtained. The initial values may be arbitrarily set. The initial values may be defined by the system designer or input by the user.

The quantitative analyzer 24 of FIG. 4 may perform quantitative analysis by estimating and obtaining the type and concentration c of the reference substance that corresponds to a metabolite in the target region, through the curve fitting. In this case, the quantitative analyzer 24 may be programmed with various curve-fitting algorithms, e.g., the Levenberg-Marquardt algorithm and a curve fitting algorithm that uses the VARPRO. In an exemplary embodiment, the quantitative analyzer 24 may be programmed to minimize the equation 2 or 3 with an iterative method.

Figure 8A:
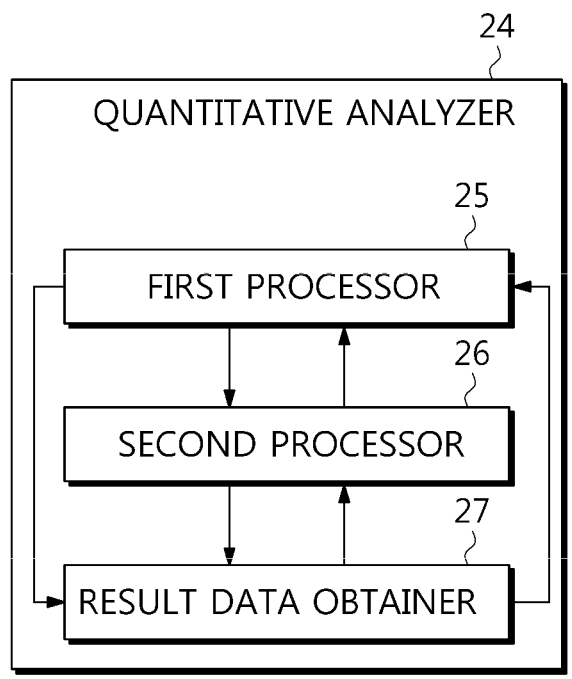
FIG. 8A is a block diagram of a quantitative analyzer, according to an exemplary embodiment.

FIG. 8A is a block diagram of a quantitative analyzer, according to an exemplary embodiment.

Referring to FIG. 8A, the quantitative analyzer 24 includes a first processor 25, a second processor 26, and a resultant data obtainer 27. For convenience of explanation, the first processor 25, second processor 26, and resultant data obtainer 27 are shown to be separated. However, in one or more exemplary embodiments, they may be implemented as not being physically separated in the quantitative analyzer 24. They may also be implemented with physically separated semiconductor chips and associated components.

The first processor 25 obtains first parameters to minimize the mathematical expression used in curve fitting, e.g., one that may be derived from a signal model, and the second processor 26 obtains second parameters, which are different from the first parameters, to minimize the mathematical expression used in curve fitting, e.g., one that may be derived from a signal model. The mathematical expression that may be derived from a signal model, as herein used, may include, e.g., the equation 2 or 3.

In an exemplary embodiment, the first parameters may have $\alpha$ and $\beta$ of the equation 3, and the second parameter may have the number of bases and concentration of the reference substance c of the equation 3. In another exemplary embodiment, the first parameters may have the number of bases and concentration of the reference substance c of the equation 3, and the second parameters may have $\alpha$ and $\beta$ of the equation 3.

The first processor 25 may receive initial values for $\alpha$ and $\beta$ from the input interface 21. The initial values for $\alpha$ and $\beta$ may be input to the input interface 21 through a separate input interface, e.g., a keyboard, by manipulation of the user, as described above.

In an exemplary embodiment, the first processor 25 may apply the initial values for $\alpha$ and $\beta$ to a mathematical expression used in curve fitting, e.g., the equation 3, and calculate the number of bases b and concentration of the reference substance c to minimize the equation 3. In this case, the first processor 25 may use the convex optimization in calculating the number of bases b and concentration of the reference substance c to minimize the equation 3. A minimum value of the equation 3 with the calculated number of bases b and concentration of the reference substance c is referred to as a first minimum value. The calculated number of bases b and concentration of the reference substance c may be sent to the second processor 26.

The second processor 26 may apply the number of bases b and concentration of the reference substance c calculated by the first processor 25 to the equation 3, and thus obtain $\alpha$ and $\beta$ to minimize the equation 3. The second processor 26 may also use the convex optimization in obtaining $\alpha$ and $\beta$ to minimize the equation 3, thus obtaining updates of $\alpha$ and $\beta$. In this case, the minimum value of the equation 3 may be a second minimum value, which is smaller than the first minimum value. The updates of $\alpha$ and $\beta$ may be sent to the first processor 26.

The first processor 25 may receive the updates of $\alpha$ and $\beta$ sent from the second processor 26, apply the updates to $\alpha$ and $\beta$ of the equation 3, and re-calculate the number of bases b and concentration of the reference substance c to minimize the equation 3, thereby obtaining updates of the number of bases b and concentration of the reference substance c. In this case, a minimum value of the equation 3, called a third minimum value, may be smaller than the second minimum value. The re-calculated updates of the number of bases b and concentration of the reference substance c may be sent to the second processor 26.

The second processor 26 may apply the updates of the number of bases b and concentration of the reference substance c re-calculated by the first processor 25 to the equation 3, and thus obtain updates of $\alpha$ and $\beta$ again by calculating $\alpha$ and $\beta$ to minimize the equation 3. In this case, a minimum value of the equation 3, called a fourth minimum value, may be smaller than the third minimum value.

As such, the first and second processors 25 and 26 may obtain optimum estimate data while exchanging data, i.e., $\alpha$ and $\beta$, and the number of bases b and concentration of the reference substance c.

In another exemplary embodiment, the first processor 25 may receive initial values for the number of bases b and concentration of the reference substance c from the input interface 21, or receive the calculated number of bases b and concentration of the reference substance c from the second processor 26. The first processor 25 may apply the received number of bases b and concentration of the reference substance or their initial values to the equation 3, and then obtain $\alpha$ and $\beta$ to minimize the equation 3. The second processor 26 may then receive $\alpha$ and $\beta$ from the first processor 25, apply the received $\alpha$ and $\beta$ to the equation 3, and calculate the number of bases b and concentration of the reference substance c to minimize the equation 3. Also, in this case, the first and second processors 25 and 26 may obtain optimum estimate data while exchanging mutual data, i.e., $\alpha$ and $\beta$, and the number of bases b and concentration of the reference substance c.

The resultant data obtainer 27 obtains optimum estimate data resulting from operation of the first and second processors 25 and 26. In an exemplary embodiment, if the first and second processors 25 and 26 obtain $\alpha$ and $\beta$, and the number of bases b and concentration of the reference substance c through iteration as many as a predetermined number of times, the resultant data obtainer 27 may send the first and second processors 25 and 26 control signals to stop operation of obtaining $\alpha$ and $\beta$, and the number of bases b and concentration of the reference substance c, and obtain $\alpha$ and $\beta$, and the number of bases b and concentration of the reference substance c at the stop time as estimate data. In another exemplary embodiment, if the minimum value of the equation 3 calculated by the first and second processors 25 and 26 is smaller than a predetermined value, the resultant data obtainer 27 may send the first and second processors 25 and 26 control signals to stop operation of obtaining α and β, and the number of bases b and concentration of the reference substance c, and obtain α and β, and the number of bases b and concentration of the reference substance c at the stop time as estimate data.

Although, for convenience of explanation, the first and second processors 25 and 26 of the quantitative analyzer 24 uses the equation 2 or 3 to obtain α and β, and the number of bases b and concentration of the reference substance c, the mathematical expression to be used in the first and second processors 25 and 26 are not limited to the equations 2 and 3. Various mathematical expressions or algorithms for curve fitting of a signal model to compensate for external factors with the Gaussian model, as represented in the equation 1, may be used by the first and second processors 25 and 26.

The resultant data obtainer 27 may send at least one of the obtained α and β, and the number of bases b and concentration of the reference substance c to the output interface 28 of FIG. 4.

Figure 8B:
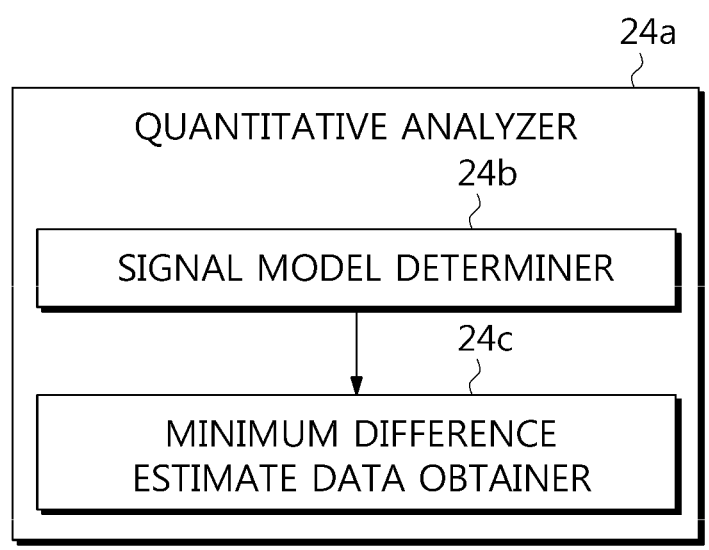
FIG. 8B is a block diagram of a quantitative analyzer, according to another exemplary embodiment.

FIG. 8B is a block diagram of a quantitative analyzer, according to another exemplary embodiment.

Referring to FIG. 8B, a quantitative analyzer 24a includes a signal model determiner 24b and a minimum-difference estimate data obtainer 24c.

The signal model determiner 24b determines a signal model for calculating estimate data. As described above, the estimate data is used to estimate measurement data of the target region. The signal model determiner 24b may determine the signal model in the form as represented in the equation 1. In this case, the signal model determiner 24b may determine the signal model by reflecting an external factor compensation value that compensates for an external factor that affects the measurement data. The external factor compensation value may be determined using a Gaussian model. Furthermore, the signal model determiner 24b may reflect at least one of a reference data compensation value to compensate for an error between reference data and measurement data, a basis compensation value, which is a weight for the basis, and a phase compensation value to compensate for a phase difference between estimate data and measurement data, to the signal model. The signal model determined by the signal model determiner 24b may be sent to the minimum-difference estimate data obtainer 24c.

The minimum-difference estimate data obtainer 24c uses the signal model determined by the signal model determiner 24b to obtain minimum-difference estimate data that minimizes the difference between measurement data and estimate data in the target region. The minimum-difference estimate data obtainer 24c may obtain the minimum-difference estimate data as well as various parameters in the signal model, e.g., the number of bases, concentration of the reference substance, an external factor compensation value, a reference data compensation value, a basis compensation value, or a phase compensation value.

The minimum-difference estimate data obtainer 24c may obtain the minimum-difference estimate data by comparing estimate data given by the signal model and the measurement data of the target region. In this case, the minimum-difference estimate data obtainer 24c may obtain the minimum-difference estimate data, using an iterative method, and for this, it may use the Levenberg-Marquardt algorithm. Alternatively, the minimum-difference estimate data obtainer 24c may use the VARPRO method. In this case, as described above in an exemplary embodiment in connection with FIG. 8A, the minimum-difference estimate data obtainer 24c may obtain minimum-difference measurement data in a way that treats some of the plurality of parameters as constants while treating some other of the parameters as variables to obtain the some other parameters to minimize the difference between estimate data and measurement data of the target region, and subsequently, treats the obtained some other parameters as constants while treating the some parameters as variables to calculate the some parameters to minimize the difference between the estimate data and the measurement data of the target region.

The output interface 28 of FIG. 4 outputs at least one of α and β, and the number of bases b and concentration of the reference substance c to an external processor or display device. The output interface 28 may be connected to another processor. The other processor connected to the output interface 28 may process the data sent from the output interface 28 to have a form for the user to check the quantitative analysis results. In one or more exemplary embodiments, the processor 20 may process at least one of α and β, and the number of bases b and concentration of the reference substance c to have a form for the user to check such parameters. In one or more exemplary embodiments, the output interface 28 may be omitted.

An exemplary embodiment where the quantitative analysis apparatus 1 corresponds to an MRI apparatus will now be described. The MRI apparatus may perform quantitative analysis using magnetic resonance spectroscopy (MRS).

Figure 9:
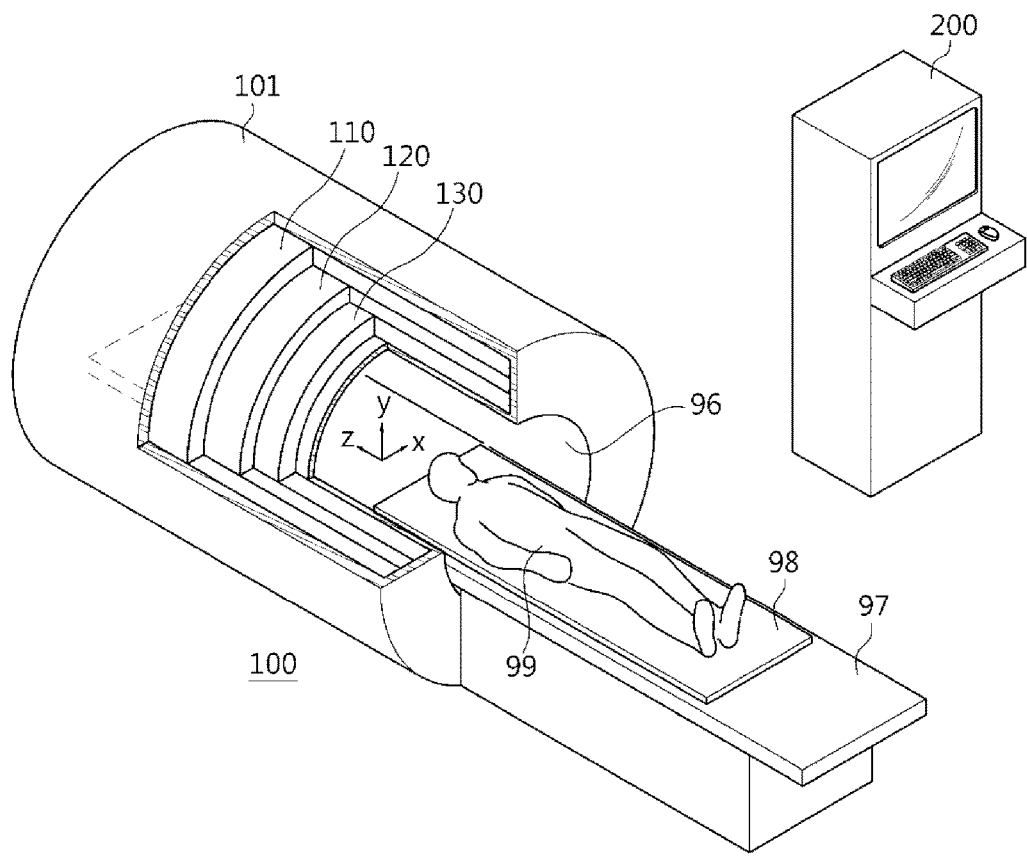
FIG. 9 is a perspective view of a magnetic resonance imaging (MRI) apparatus, according to an exemplary embodiment.

FIG. 9 is a perspective view of an MRI apparatus, according to an exemplary embodiment.

Referring to FIG. 9, in an exemplary embodiment, an MRI apparatus 100 includes a main body 101 having a bore 96 formed to be an internal cavity.

Figure 10:
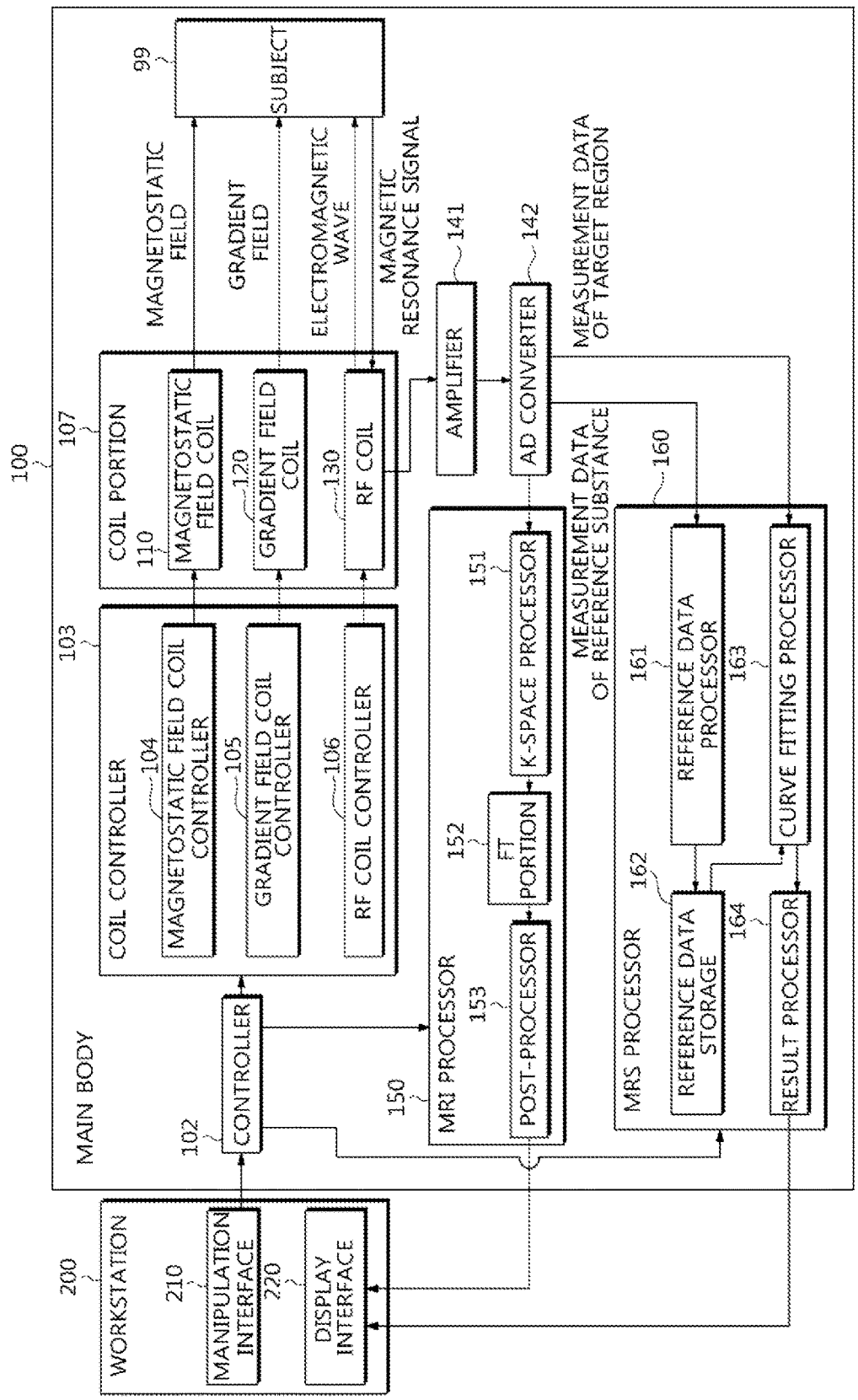
FIG. 10 is a block diagram of an MRI apparatus, according to an exemplary embodiment.

The main body 101 is equipped with a conveyer 98 that may enter into the bore 96 or be withdrawn from the bore 96, and a supporter 97, on top of which the conveyer 98 is installed. Various equipment to move the conveyer 98 may be installed in the conveyer 98 and the supporter 97. For example, parts like wheels, rails, or toothed wheels may be installed in at least one of the conveyer 98 and the supporter 97. A subject 99, e.g., a human body, lies on the conveyer 98 and be conveyed into or out of the inside of the bore 96. In the main body 101, various components may be equipped to obtain MRI images. For example, as shown in FIG. 10, a coil portion 107 is installed in the main body 101 to apply RF pulses to the subject 99. The coil portion 107 includes a magnetostatic field coil 110, a gradient field coil 120, and an RF coil 130. As shown in FIG. 9, the MRI apparatus 100 includes a workstation 200.

FIG. 10 is a block diagram of an MRI apparatus, according to an exemplary embodiment.

Referring to FIG. 10, the MRI apparatus 100 includes a controller 102, a coil controller 103, a coil portion 107, an amplifier 141, an analog-to-digital (AD) converter 142, an MRI processor 150, and a magnetic resonance spectroscopy (MRS) processor 160.

In an exemplary embodiment, the controller 102, the coil controller 103, the amplifier 141, the analog-to-digital converter 142, the MRI processor 150, and the MRS processor 160 may be physically or logically separated. The controller 102, the coil controller 103, the amplifier 141, the analog-to-digital converter 142, the MRI processor 150, and the MRS processor 160 may be implemented with the respective different processors. In one or more exemplary embodiments, the controller 102, the coil controller 103, the amplifier 141, the analog-to-digital converter 142, the MRI processor 150, and the MRS processor 160 may all be implemented with a single processor. The processor(s) may be implemented with at least one semiconductor chips and associated components.

The controller 102 controls operation of the MRI apparatus 100 by generating control signals and sending them to the respective components of the MRI apparatus 100. The controller 102 may be implemented with a processor embedded in the main body 101 of the MRI apparatus 100. In one or more exemplary embodiments, the controller 102 may be included in the workstation 200. The controller 102 may send the control signal to the coil controller 103 in response to an electric signal sent from a manipulation interface 210. The controller 102 may also send control signals to the MRI processor 150 and the MRS processor 160.

The coil controller 103 controls the coil portion 107 by applying current to the coil portion 107. The coil controller 103 includes a magnetostatic coil controller 104, a gradient coil controller 105, and an RF coil controller 106. The magnetostatic coil controller 104, the gradient coil controller 105, and the RF coil controller 106 applies current for the magnetostatic coil 110, the gradient coil 120, and the RF coil 130, respectively, to produce magnetostatic fields, gradient magnetic fields, and RF pulses or electromagnetic waves, respectively.

The coil portion 107 may apply magnetic fields and RF pulses to the subject 99 that has been conveyed into the bore 96, to induce magnetic resonance inside the subject 99, and collect information about an internal cross-section of the subject 99 by collecting magnetic resonance signals produced from the magnetic resonance. In this case, the coil portion 107 collects the magnetic resonance signals from the subject 99, using nuclear magnetic resonance (NMR), which is a phenomenon in which the nuclei are resonant with RF pulses at a frequency.

The phenomenon of magnetic resonance will now be described in more detail.

An atomic nucleus of an element like hydrogen H, phosphorus P, sodium Na, or any isotope of carbon C in the subject, e.g., a human body has spins. When the nucleus is magnetized by being exposed to an external magnetic field, the spins of the nucleus are arranged in the direction of the magnetic field, rotating fast while forming an angle with the central axis due to torque exerted by the magnetic field. Such rotational motion of the spins of the nucleus is referred to as precession. A frequency of the precession of the nuclei spin is called the Larmor frequency. The Larmor frequency may depend on the strength of the external magnetic field and type of the nucleus. When RF pulses with a frequency identical or similar to the Larmor frequency are applied to the nuclei during the precession, the magnetization vector of the nuclei heads for a direction perpendicular to the applied magnetic field. At this time, the magnetization vector induces a voltage signal, called an FID signal to an adjacent high-frequency coil, which is called the NMR phenomenon.

The coil portion 107 may apply a magnetic field to the subject and receive the FID signal induced from the subject, thus enabling the MRI apparatus to generate and provide an image of the target region for the user.

As described above, to obtain a magnetic resonance signal using the NMR phenomenon, the coil portion 107 may include the magnetostatic coil 110, gradient coil 120, and RF coil 130. In an exemplary embodiment, the RF coil 130 may include a transmit coil to apply RF pulses to the subject 99, and a receive coil to receive the FID signal from the subject 99. In another exemplary embodiment, the RF coil 130 may include a transceive coil to apply RF pulses to the subject 99 and receive the FID signal from the subject 99. The magnetostatic coil 110, gradient coil 120, and RF coil 130 may be built in the main body 101, as shown in FIG. 9. In one or more exemplary embodiments, the RF coil 130 may not be installed in the main body 101.

Figure 11:
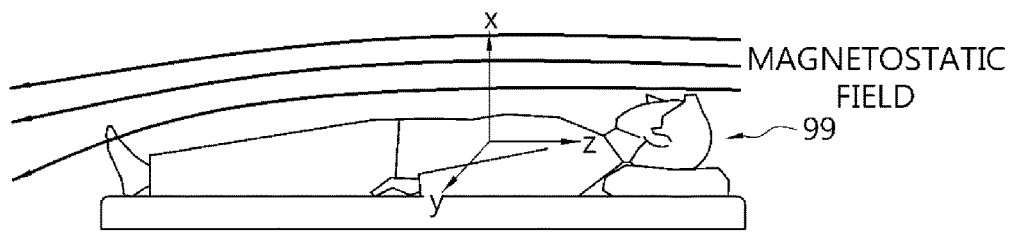
FIG. 11 is a view illustrating a magnetostatic field of an MRI apparatus.

FIG. 11 is a view illustrating a magnetostatic field of an MRI apparatus.

The magnetostatic coil 110 produces a magnetostatic field to magnetize the nucleus of an element among elements distributed in the human body, which induces the magnetic resonance phenomenon, such as H, P, Na, etc. The magnetostatic field produced from the magnetostatic coil 110 may be parallel with the coaxial plane of the bore.

Assuming that a direction parallel with the movement direction of the conveyer 98 corresponds to the z-axis, a direction perpendicular to the z-axis and parallel with the ground plane corresponds to the x-axis, and a direction perpendicular to the z-axis and the ground plane corresponds to the y-axis, as shown in FIGS. 9 and 11, the magnetostatic field may be produced along the z-axis, as shown in FIG. 11. If the subject 99 is a human body, the magnetostatic field may be produced in the direction from head to toe of the human body. The aforementioned Larmor frequency is proportional to the strength of the magnetostatic field produced around the subject 99.

The magnetostatic coil 110 may be made from a superconducting electromagnet or a permanent magnet. To produce a magnetic field with magnetic concentration higher than 0.5 Tesla (T), the superconducting electromagnet may be used. If the nuclei of elements, such as H, P, Na, etc., are exposed to the magnetostatic field as described above, the nuclei are magnetized and the magnetization vector of the nuclei starts to precess.

Figure 12:
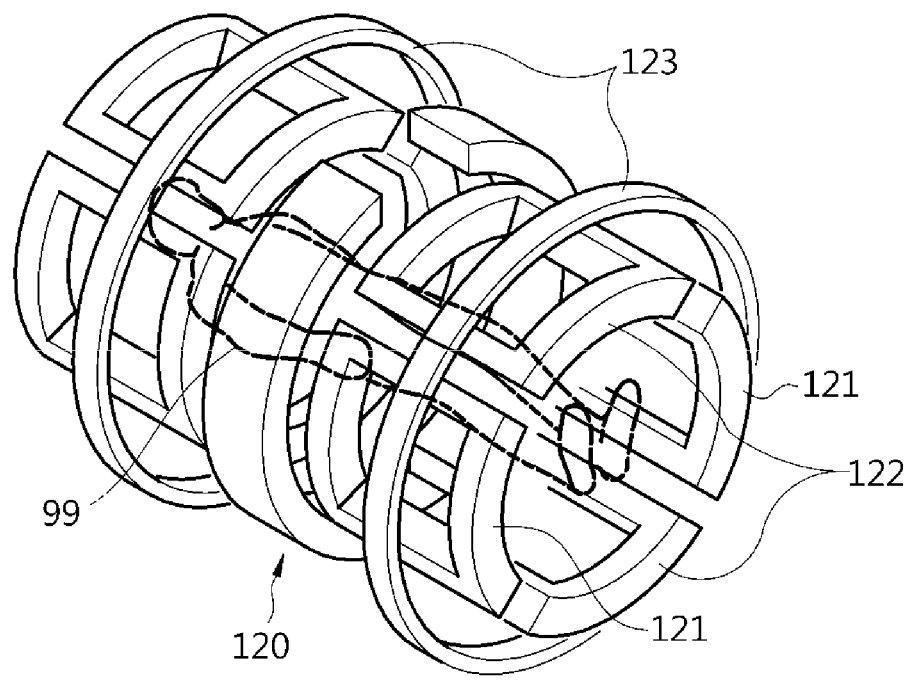
FIG. 12 is a view of a gradient coil of an MRI apparatus, according to an exemplary embodiment.

FIG. 12 is a gradient coil of an MRI apparatus, according to an exemplary embodiment.

The gradient coil 120 produces spatially linear gradient fields Gx, Gy, Gz for the subject 99 inside the bore, causing a change in uniformity of the magnetic field. Accordingly, the gradient coil 120 may spatially control the rotation frequency or phase of the magnetization vector, so that an MRI signal may be represented in the spatial/frequency domain, i.e., in the k-space, when the magnetization vector of the nuclei of the elements such as H, P, Na, etc., formed by the magnetostatic field rotates on the transverse plane.

As shown in FIG. 12, the gradient coil 120 includes three types of gradient coils 121, 122, and 123 that produce gradient fields in the direction of x, y, and z-axes for capturing MRI images. The respective gradient coils 121, 122, and 123 produce gradient fields Gx, Gy, and Gz with different gradients.

The z-axis gradient coil 121 produces a slice-select gradient field Gz in the direction of the z-axis to be used in selection of a slice. The y-axis gradient coil 122 produces a phase-encoding gradient field in the direction of the y-axis to cause phase shifting for lines of slices to have different phases for phase encoding. The x-axis gradient coil 123 produces a frequency-encoding gradient field in the direction of the x-axis to make spins that make up each line have different frequencies to distinguish the individual spins.

Figure 13:
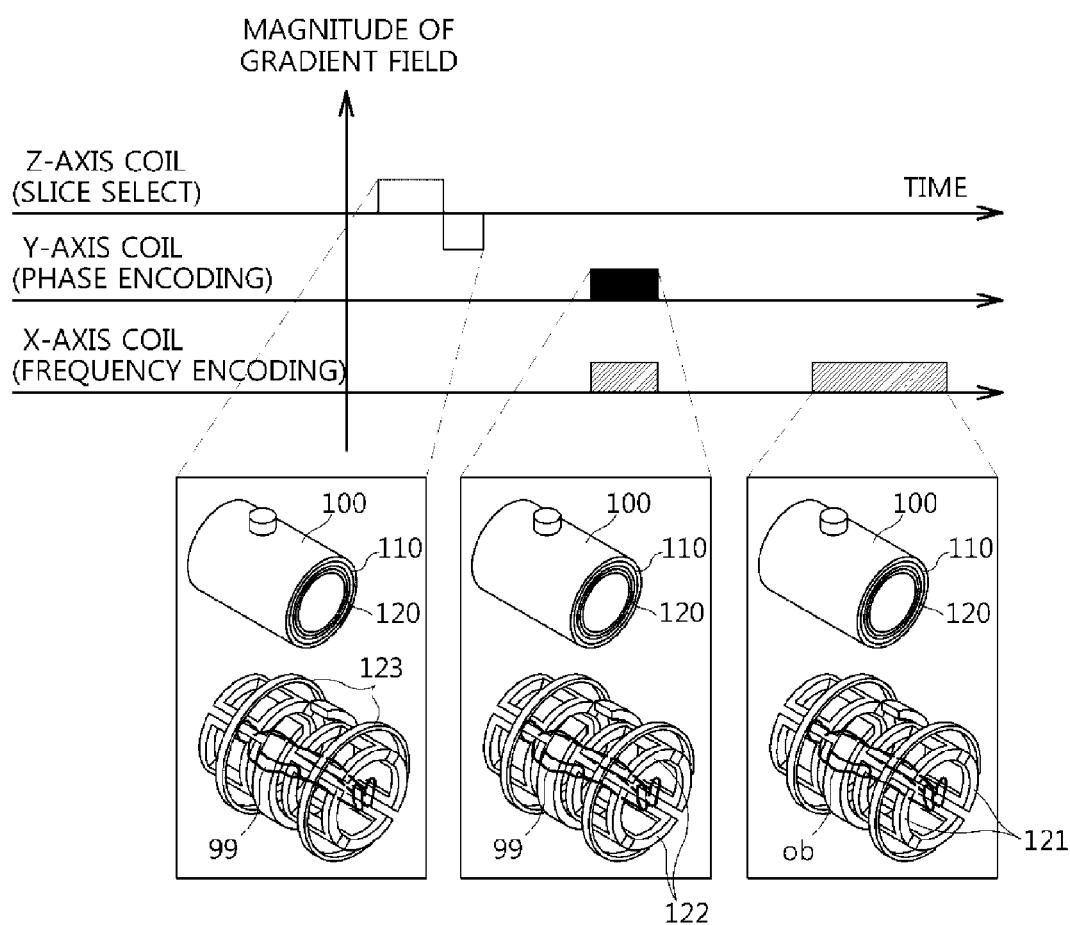
FIG. 13 is a diagram illustrating pulse sequences of respective gradient coils of FIG. 12.

FIG. 13 is a diagram illustrating pulse sequences of respective gradient coils of FIG. 12.

As shown in FIG. 13, first, the z-axis gradient field Gz is produced by the z-axis gradient coil 123. For example, the z-axis gradient coil 123 may produce a magnetic field with a gradient in the direction of the z-axis inside the bore 96, such that, if the subject 99 is a human body, the magnetic field has less strength as it proceeds from head to toe of the human body. In this case, when the RF coil 130 transmits RF pulses at a single frequency, magnetic resonance signals are produced from the slices applied with a magnetic field corresponding to the frequency of the RF pulses, enabling at least one slice to be selected. Spins of the selected slice have all the same frequency and phase, thus making it unclear to distinguish the individual spins.

The y-axis gradient coil 122 may produce a phase-encoding gradient field Gy in the direction of the y-axis. The phase-encoding gradient field Gy causes different phase shifts for the spins of the slices. In other words, once the y-axis gradient field is produced, spins applied with a large gradient field undergo the phase shift at higher frequencies, and spins applied with a small gradient field undergo the phase shift at lower frequencies. If the y-axis gradient field is cut off, all the spins perform procession at a frequency, but may be individually identified because the y-axis gradient field causes permanent phase shifting. This is called phase encoding.

While the magnetic resonance signal is obtained, the x-axis gradient coil 121 applies a frequency-encoding gradient field Gx in the direction of the x-axis to the subject 99 or object ob. If a slice is represented in a matrix, spins that make up each line are allocated different frequencies and thus be identified. This is called frequency encoding.

As described above, once the magnetostatic field and gradient field are applied to the subject 99, the transmit coil or transceive coil of the RF coil 130 may apply RF pulses to the target region of the subject 99. With the RF pulses applied from the RF coil 130 to the target region, the nuclei start processing according to a new magnetic component of the RF pulses. In other words, a transverse magnetization vector may be produced for the nuclei. If the nuclei processing at a frequency are applied with RF pulses with the same frequency, magnetic resonance occurs in the target region. At this time, the rotation of the magnetization vector, i.e., spin, may induce an electromotive force to a high frequency coil of the RF coil 130, e.g., the receive coil or transceive coil. Accordingly, the RF coil 130 may receive an FID signal from the subject 99.

Figure 14:
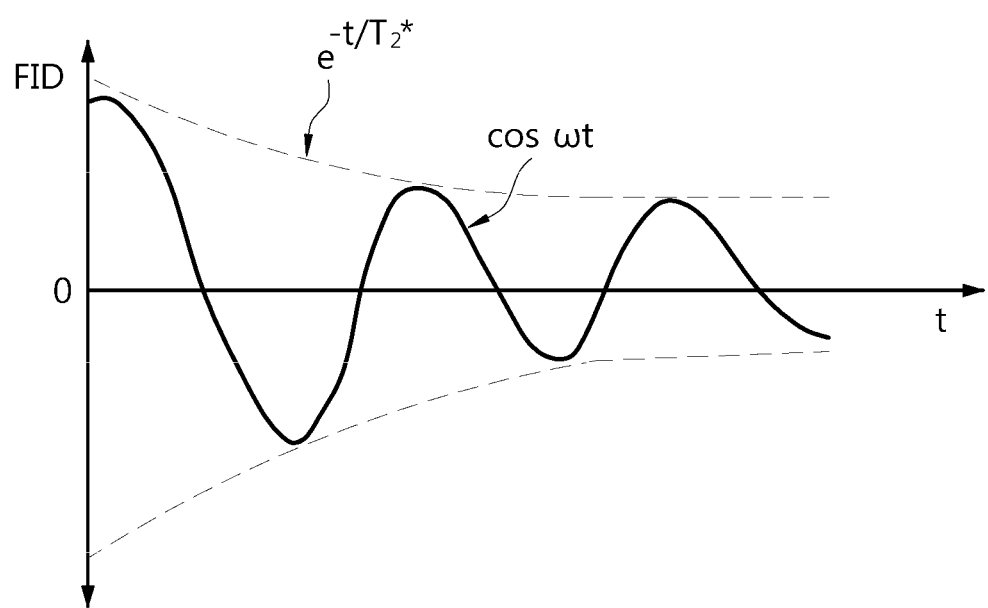
FIG. 14 is a graph of a free induction decay (FID) signal.

FIG. 14 is a graph of an FID signal.

Referring to FIG. 14, an FID signal may have a damping waveform. In this case, the waves may be damped according to a mathematical expression $e^{-t/T_2^*}$, and vibrate according to cos ωt. The FID signal may have decreasing amplitude due to dephasing of the nuclei. In the meantime, if the application of the RF pulse is terminated, the transverse magnetization vector may collapse at a speed ($T_2$ collapse), in which case the speed may follow a time constant $T_2$. $T_2^*$ of the damping of the FID signal may be determined to include not only the $T_2$ collapse but also the dephasing due to a non-uniform magnetic field. Accordingly, the damping speed $T_2^*$ of the FID signal may be faster than the $T_2$ collapse.

Hereinafter, the FID signal received from the RF coil 130, or corresponding signal is referred to as a magnetic resonance signal.

Referring again to FIG. 10, the magnetic resonance signal obtained by the RF coil 130 may be sent to the amplifier 141. The amplifier 141 amplifies the magnetic resonance signal. In this case, the magnetic resonance signal may have the form of an analog signal. The amplified magnetic resonance signal may be sent to the analog-to-digital converter 142.

The analog-to-digital converter 142 converts the analog magnetic resonance signal to a digital magnetic resonance signal by performing sampling on the amplified magnetic resonance signal at a predetermined sampling rate. The analog-digital converter 142 may send the digitally converted signal to the MRI processor 150 or MRS processor 160.

The MRI processor 150 receives the magnetic resonance signal output from the analog-to-digital converter 142, generates a k-space using the received magnetic resonance signal, and creates an MRI image using the k-space.

The MRI processor 150 includes a k-space processor 151, a Fourier transform (FT) portion 152 for performing Fourier transform of the k-space, and a post-processor 153 for performing post-processing on the MRI image obtained through Fourier transform.

The k-space processor 151 generates a k-space based on the received magnetic resonance signal. The k-space processor 151 may obtain k-space data from the FID signal, and generate the k-space by arranging the obtained k-space data in a predefined way. Because the FID signal is damped according to, e.g., the dephasing, as described above, as for arrangement of signals in a data space, the magnetic resonance signal may have the maximum amplitude at the center of the data space. Therefore, the k-space may have the strongest signal in the center region. The generated-space may be delivered to the FT portion 152.

By performing Fourier transform on the k-space, an MRI image corresponding to the k-space may be obtained. The FT portion 152 may obtain the MRI image by transforming the k-space via the Fourier transform.

The MRI image may be sent to the post-processor 153. The post-processor 153 may adjust the MRI image by controlling brightness, sharpness, contrast, or the like of the whole or a part of the MRI image. In one or more exemplary embodiments, the post-processor 153 may be able to create a three-dimensional (3D) stereoscopic image using multiple MRI images. The post-processor 153 may be omitted in one or more exemplary embodiments.

The MRI image obtained by the MRI processor 150 may be displayed on a display 220 of the workstation 200.

The MRS processor 160 receives the magnetic resonance signal output from the analog-to-digital converter 142, and performs MRS on the received magnetic resonance signal.

The MRS processor 160 may perform different processes depending on from which subject 99 the magnetic resonance signal has been obtained. The MRS processor 160 may generate reference data for a reference substance if a magnetic resonance signal for the reference substance is received, and perform quantitative analysis with the reference data if an MRI signal for the subject to be examined is received.

Referring to FIG. 10, the MRS processor 160 includes a reference data processor 161, a reference data storage 162, a curve fitting processor 163, and a result processor 164.

Figure 15:
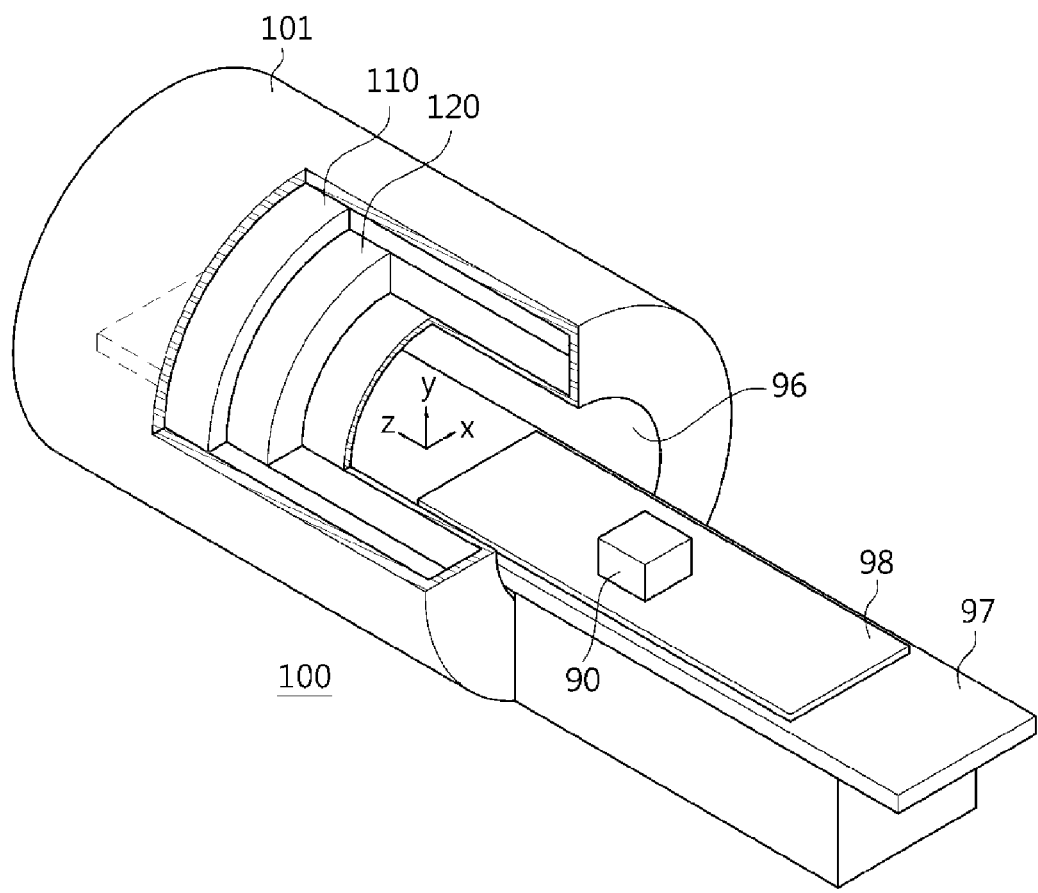
FIG. 15 is a perspective view illustrating obtaining reference data for a reference substance, according to an exemplary embodiment.
Figure 16:
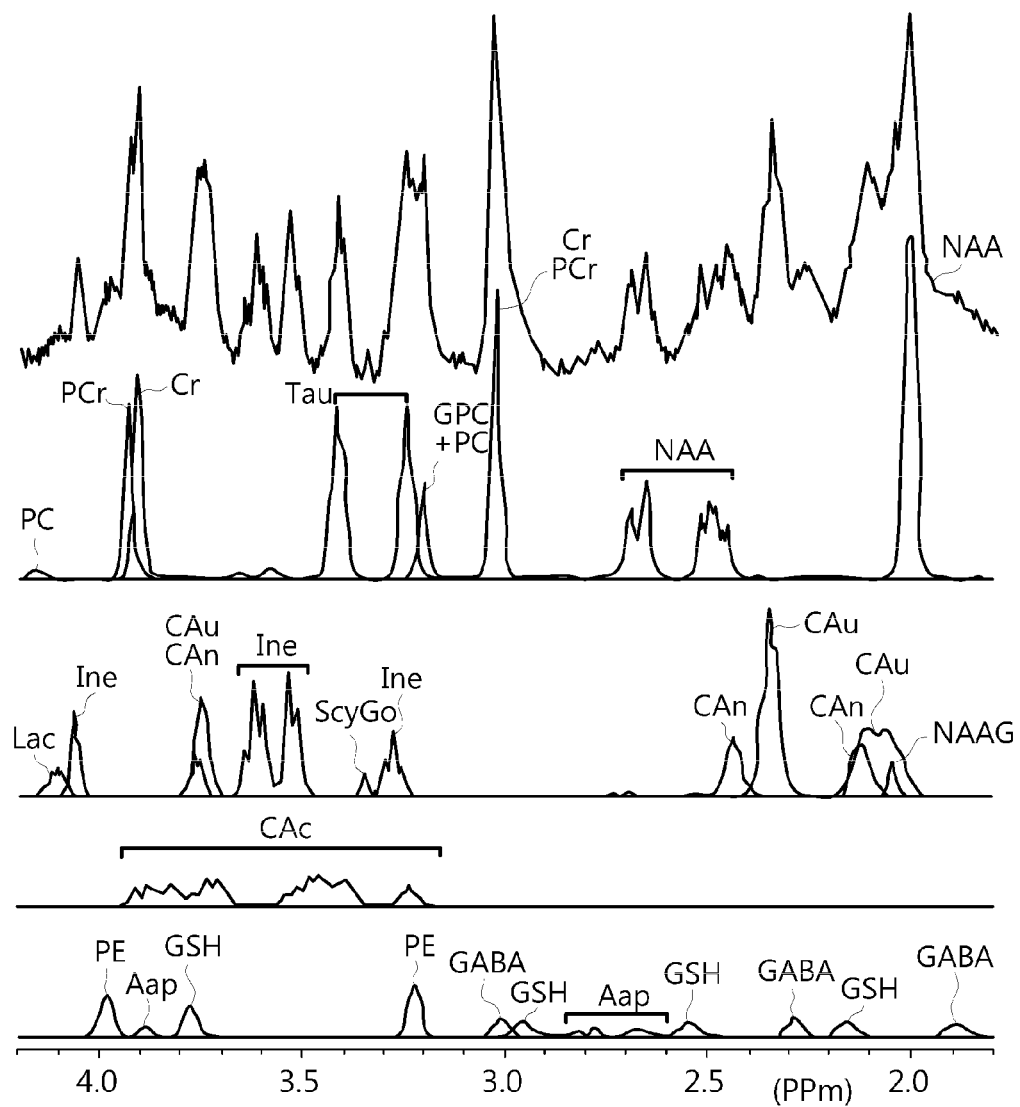
FIG. 16 is a diagram illustrating a spectrum for the reference substance, which is the reference data, of FIG. 15.

FIG. 15 is a perspective view illustrating obtaining reference data for a reference substance, according to an exemplary embodiment, and FIG. 16 is a diagram illustrating a spectrum for the reference substance, which is the reference data, of FIG. 15.

As shown in FIG. 15, in the MRI apparatus 100, a reference substance 90 is placed on the conveyer 98, and the MRI apparatus 100 conveys the reference substance into the bore 96, and then obtains a magnetic resonance signal for the reference substance 90 by applying a magnetic field and RF pulses to the reference substance 90.

The reference substance 90 may include a metabolite produced by biological activities in the target region inside the subject, such as a human body.

For example, if the target region is the brain, the reference substance may include L-alanie, aspartate, creatine, glucose, glutamine, glutamate, glutathione (GSH), L-lactate), taurine, myo-Inositol, phosphocreatine, γ-aminobutyric acid, phosphocholine, Glycerophosphocholine (GPC), N-acetylaspartate, N-acetyl aspartylglutamatemetabolites, which are metabolites produced in the brain. Besides, the type of the target region, or many different substances that may be experimentally found in the target region may be used as the reference substance.

As described above, once the magnetic resonance signal for the reference substance is obtained, the reference data processor 161 of FIG. 10 may obtain reference data based on the magnetic resonance signal for the reference substance. The reference data processor 161 may obtain the reference data by using a predefined algorithm. The reference data may be represented in the time domain or the frequency domain.

Each reference substance may output a signal with a frequency, amplitude and strength, and accordingly has a corresponding spectrum, as shown in FIG. 16. The spectrum of the respective reference substances may be used as the reference data. The reference data may be a mathematical expression in the time domain, as described above.

Referring again to FIG. 10, the reference data processor 161 stores the obtained reference data in the reference data storage 612. The reference data storage 162 may be implemented by a magnetic disk recording device, magnetic tape recording device, optical disk recording device, or semiconductor recording device installed in the main body 101 or the workstation 200. In an exemplary embodiment, the reference data processor 161 may store the reference data in the reference data storage 162 by classifying them by the type of reference substance, the type of the target region, and the type or identification number of the MRI apparatus 100.

Figure 17:
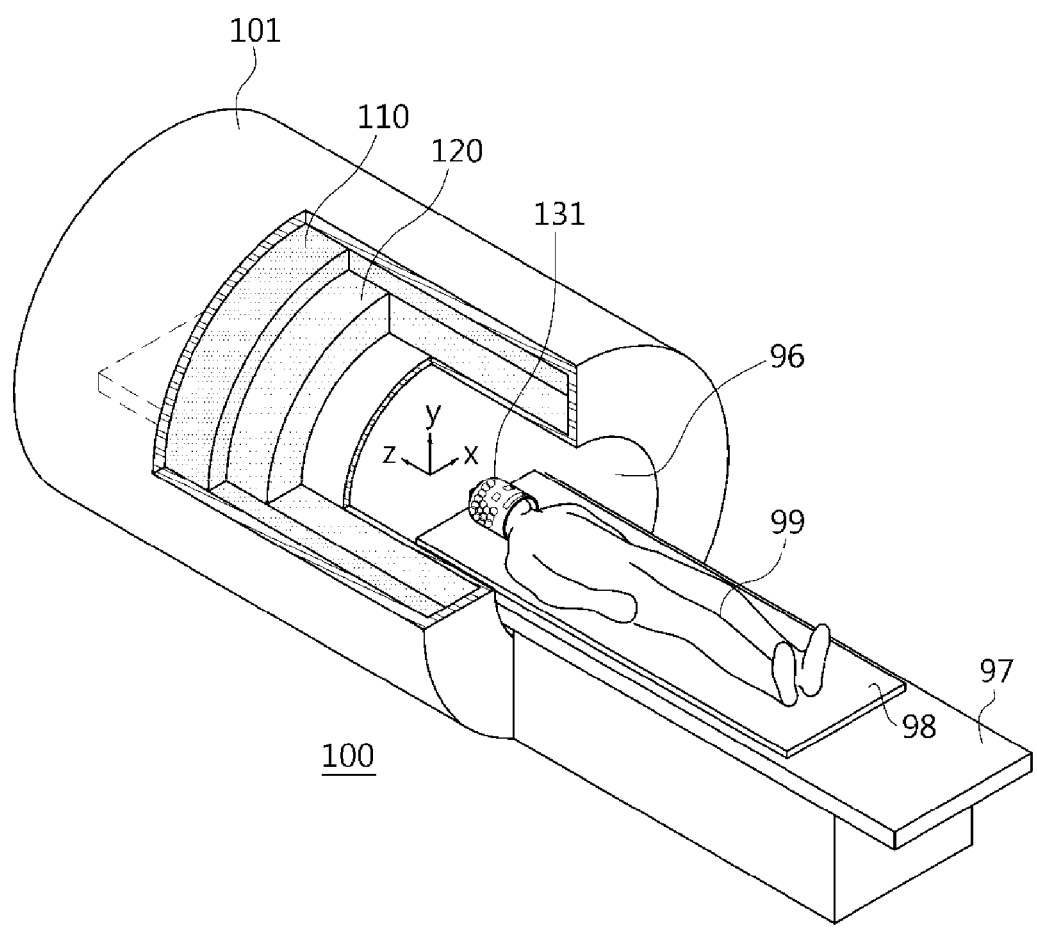
FIG. 17 is a perspective view illustrating obtaining measurement data of a target region of a subject, according to an exemplary embodiment.
Figure 18:
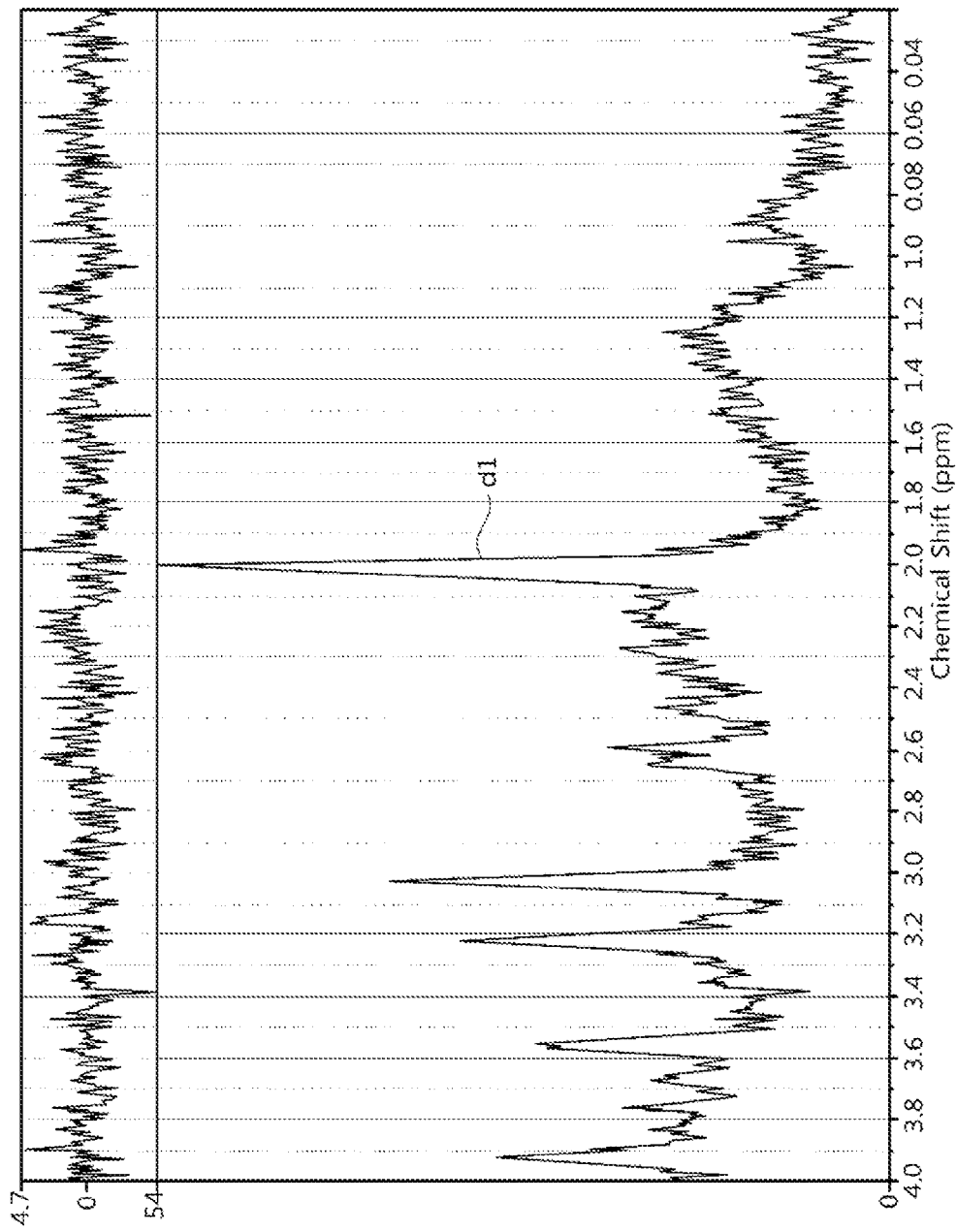
FIG. 18 is a diagram illustrating a spectrum of the measurement data obtained from the target region of the subject of FIG. 17.

FIG. 17 is a perspective view illustrating obtaining measurement data of a target region of a subject, according to an exemplary embodiment, and FIG. 18 is a diagram illustrating a spectrum of the measurement data obtained from the target region of the subject of FIG. 17.

Once the reference data is obtained, scanning of the subject 99, e.g., a human body, is performed, as shown in FIG. 17. In FIG. 17, an example where the subject 99 wears an RF coil 131 of a helmet type around the head is shown. From the subject 99 wearing the RF coil 131 of the helmet type around the head, information about the brain may be collected. In the example, quantitative analysis on the brain may then be performed.

The information collected about the brain may have a spectrum as shown in FIG. 18. After a spectrum d1 for the target region is obtained, the MRS processor 160 may perform quantitative analysis on the target region, e.g., the brain, by obtaining estimate data that corresponds to the spectrum d1 for the target region based on given reference data.

Referring again to FIG. 10, the MRS processor 160 may perform curve fitting between a signal model obtained based on the reference data and measurement data of the target region, the spectrum d1 for the target region. Accordingly, estimate data or associated various parameters may be obtained. The curve fitting processor 163 obtains minimum difference estimate data to minimize the difference between the measurement data of the target region and the signal model, or associated various parameters, and then performs quantitative analysis on them. The signal mode may be designed to compensate for an external factor by applying a Gaussian model. The parameters associated with the estimate data may include at least one of the number of bases, concentration of the reference substance, an external factor compensation value, a reference data compensation value, and a phase compensation value difference. The reference data compensation value may include the aforementioned compensation value for error or T2 time.

In an exemplary embodiment, the curve fitting processor 163 may use the signal model given in the equation 1 to obtain estimate data or associated various parameters, and further obtain minimum difference estimate data or associated various parameters to minimize the difference between the measurement data of the target region and the signal model given in the equation 1.

In an exemplary embodiment, the signal model may be given as in the following equation 4:

$$\hat{Y}(v_k) = e^{-j(\phi_0 + v_k \phi_1)} \left[ \sum_{i=1}^{N_B} b_i B_i(v_k) + \sum_{l=1}^{N_M} C_l FT\{m_l(t) e^{(\gamma_l^0, h_l, l)} e^{-\zeta t^2}\}(v_k) \right] \quad (4)$$

In equation 4, $\hat{Y}(v_k)$ of the left side refers to estimate data, and $v_k$ refers to a frequency. The right side of the equation corresponds to a signal model. In the signal model, j is a constant, $\varphi_0$ is a zero-order phase compensation value and $\varphi_1$ is a first-order phase compensation value. In the second expression in the right side, i is an index to identify a basis, and $N_B$ is the number of bases. $b_i$ indicates a basis compensation value and $B_i(v_k)$ is the basis. In the third expression of the right side, l indicates an index to identify a reference substance, and $N_M$ refers to the number of reference substances. $C_l$ indicates concentration of the reference substance with index l, and FT(A) refers to Fourier transform on A. $m_l(t)$ is a signal model for the reference substance. In this case, the signal model of the reference substance may be represented in the time domain. $\gamma_l$ corresponds to a T2 time compensation value to compensate for reduction of T2 time in the reference substance, and $\varepsilon_l$ corresponds to an error compensation value to compensate for an error that occurs when the reference substance with the index l reflects the reference data. $\zeta$ is a Gaussian damping factor for compensating for an external factor.

In an exemplary embodiment, the curve fitting processor 163 may perform curve fitting in an iterative method. In this case, the curve fitting processor 163 may use the Levenberg-Marquardt algorithm. In another exemplary embodiment, the curve fitting processor 163 may perform curve fitting through variable projection (VARPRO). In one or more exemplary embodiments, the curve fitting processor 163 may perform curve fitting by using both the Levenberg-Marquardt algorithm and VARPRO.

In an exemplary embodiment, the curve fitting processor 163 may use the equation 2 to perform curve fitting, and as a result, obtain various parameters to minimize the equation 2. In this case, the curve fitting processor 163 may apply the obtained parameters in the equation 1, to obtain the minimum difference estimate data.

In an exemplary embodiment, the curve fitting processor 163 may be implemented with the quantitative analyzer 24, 24a as shown in FIGS. 8A and 8B.

In other words, in an exemplary embodiment, the curve fitting processor 163 may perform curve fitting by repeatedly performing a method as many as a predetermined number of times or until a difference between measurement data of the target region and estimate data becomes smaller than a value, the method including receiving initial values for new parameters α and β that are made up of combinations of multiple parameters, from the manipulation interface 210, applying the initial values for α and β to a mathematical expression used in curve fitting, e.g., the equation 3, calculating the number of bases b and concentration of the reference substance c to minimize the equation 3, applying the resultant number of bases b and concentration of the reference substance c to the equation 3 to obtain updates of α and β to minimize the equation 3, and applying the updates of α and β to α and β of the equation 3 to obtain updates of the number of bases b and concentration of the reference substance c to minimize the equation 3.

In another exemplary embodiment, the curve fitting processor 163 may determine a signal model to calculate estimate data, and determine minimum difference estimate data to minimize the difference between the measurement data of the target region and the estimate data, through curve fitting.

Figure 19:
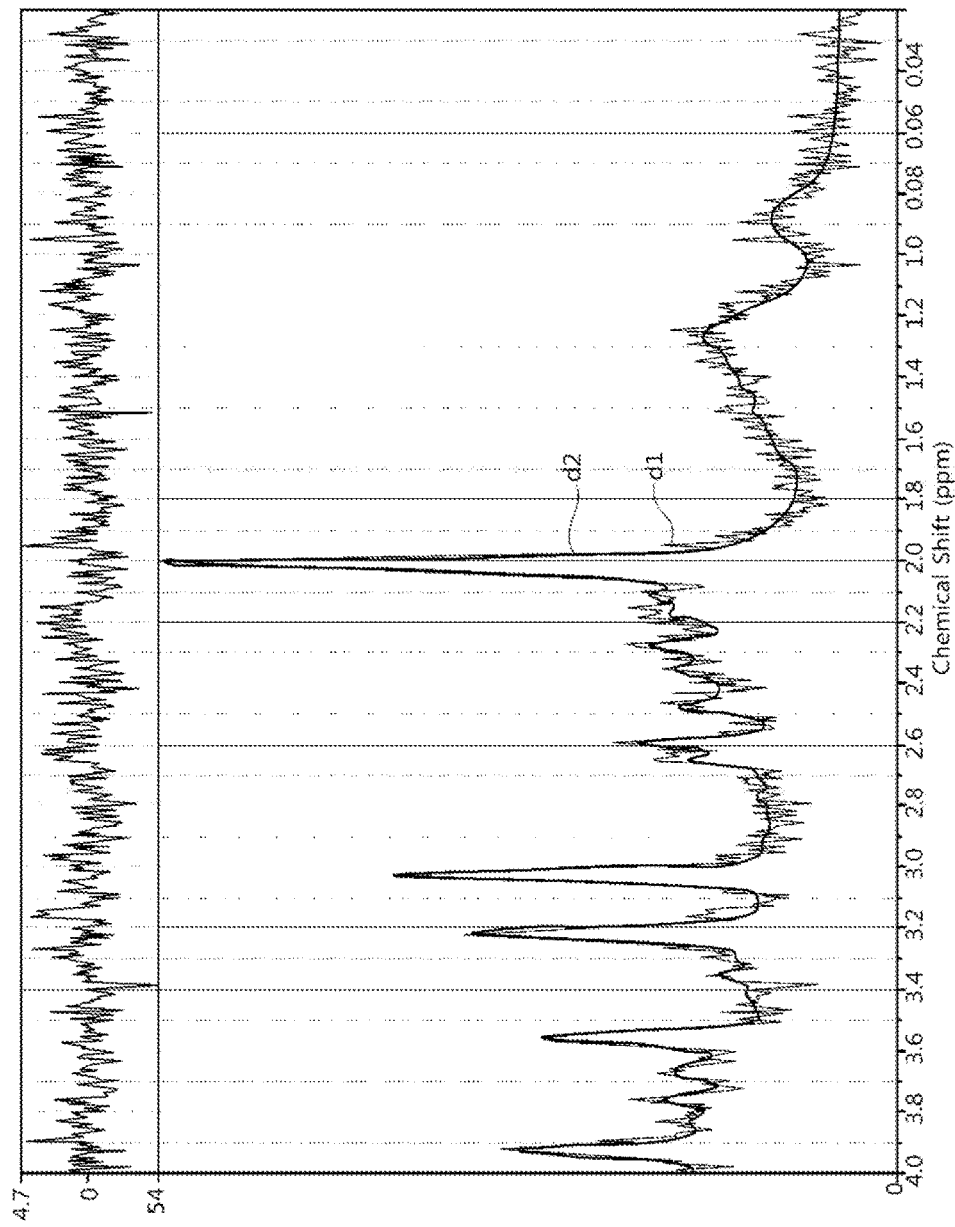
FIG. 19 is a diagram illustrating curve fitting results obtained by an MRI apparatus, according to an exemplary embodiment.

FIG. 19 is a diagram illustrating curve fitting results obtained by an MRI apparatus, according to an exemplary embodiment.

As shown in FIG. 19, after the curve fitting processor 163 performs curve fitting on the measurement data with the signal model based on the reference data, the spectrum d1 of a magnetic resonance signal of the target region and the spectrum d2 of the estimate data may correspond or approximate to each other. In this case, a part of the spectrum d1 of the magnetic resonance signal of the target region and a part of the spectrum d2 of the estimate data may be perfectly matched, some other parts of them may be approximate to each other, and the other pars may not be matched.

Figure 20:
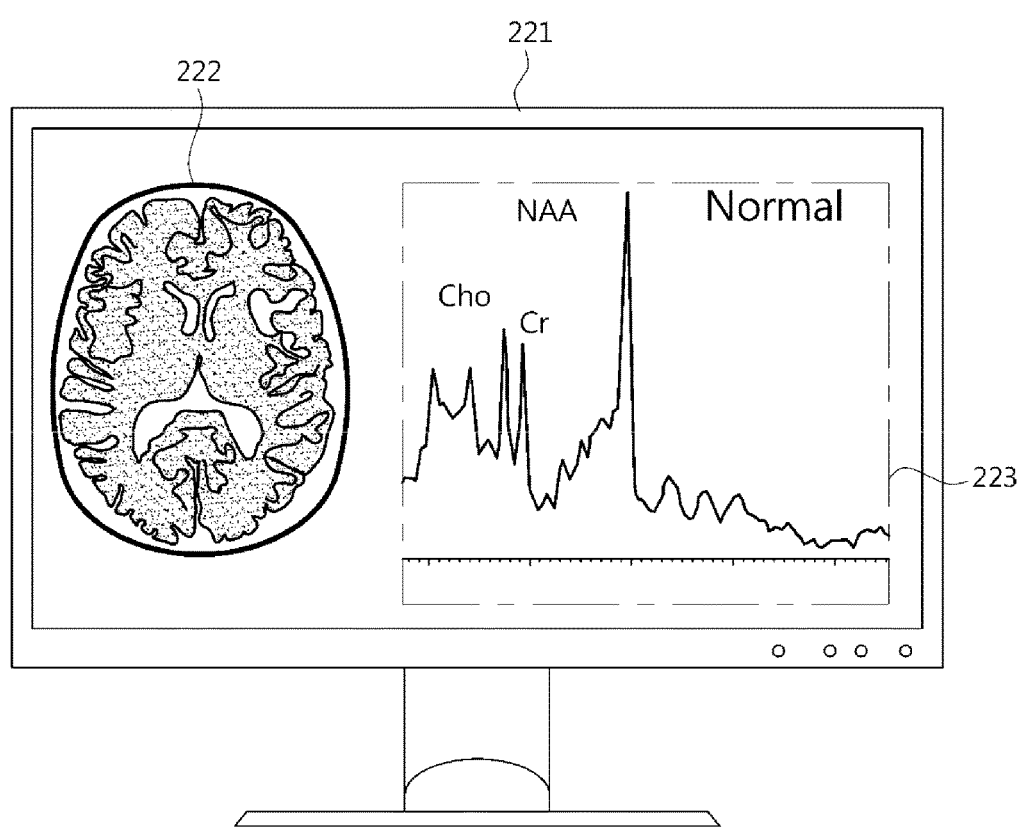
FIG. 20 is a view illustrating an MRI image obtained based on the curve fitting results of FIG. 19.

FIG. 20 is a view illustrating an MRI image obtained based on the curve fitting results of FIG. 19.

Referring to FIGS. 10 and 20, the result processor 164 performs quantitative analysis using the curve fitting result, and generates a quantitative analysis result in text, symbols, numbers, a still image, or a moving image. As described above, because the reference substance and its concentration to minimize the difference between the signal model and the measurement data in the target region may be obtained based on the curve fitting result, the result processor 164 may determine that the obtained reference substance exists in the target region to such an extent as the obtained concentration of the reference substance, and generate a quantitative analysis result in text, symbols, numbers, a still image, or a moving image according to the determination result. The quantitative analysis result may be displayed through, e.g., the display 220 for the user, as shown in FIG. 20.

In a screen 221 displayed on the display 220 for the user, various information may be presented. For example, a tomographic image 222 of the target region, e.g., the brain, or a spectrum 223 of the target region, resulting from quantitative analysis, may be displayed in the screen 221 of the display 220 in the form of images. The user may understand to what extent a metabolite exists in the target region, e.g., the brain, based on what is displayed, and accordingly, may be able to more efficiently diagnose the target region.

Referring again to FIG. 10, the main body 101 of the MRI apparatus 100 may be communicatively connected to the workstation 200. The main body 101 and workstation 200 may communicate with each other via a cable, or through various types of wireless communication network known in this art.

The workstation 200 may control operation of the main body 101, receive a user command for the control, or provide various information for the user. The workstation 200 includes the manipulation interface 210 for receiving various commands to control the workstation 200 from the user, and the display 210 for outputting images of information about operation results of the main body 101 or workstation 200, or other information for the user, as shown in FIG. 10. It may further include a sound output interface for outputting sound of the information about operation results of the main body 101 or workstation 200, or other information for the user.

As shown in FIG. 10, as the user manipulates the manipulation interface 210, the manipulation interface 210 may output an electric signal corresponding to the user's manipulation to the controller 102 of the MRI apparatus. The controller 102 may then generate a control signal corresponding to the electric signal received from the manipulation interface 210 and control the MRI apparatus 100 by sending the control signal to the coil portion 107.

Figure 21:
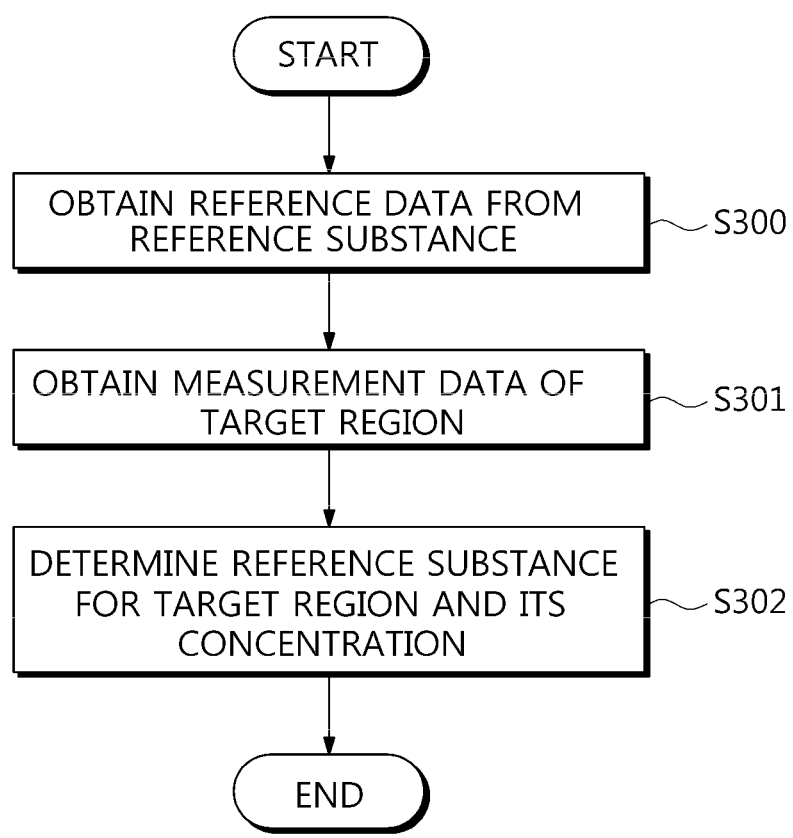
FIG. 21 is a schematic flowchart illustrating a quantitative analysis method, according to an exemplary embodiment.

FIG. 21 is a schematic flowchart illustrating a quantitative analysis method, according to an exemplary embodiment.

As shown in FIG. 21, in operation S300, reference data is obtained from at least one reference substance. The reference substance may be an individual constituent of the target region for quantitative analysis. The reference data may be any data obtained from the reference substance. For example, the reference data may be spectrum information of the reference substance, which may be obtained from the reference substance. The quantitative analysis apparatus may obtain a plurality of pieces of reference data for a plurality of reference substances by scanning the reference substances individually. The reference data may be stored in a storage in the quantitative analysis apparatus or in an external storage connected to the quantitative analysis apparatus.

In operation S301, measurement data of the target region in the subject is obtained. Obtaining the measurement data of the target region in the subject may be performed in the same way of obtaining the reference data of the reference substance. It is not necessary to obtain the measurement data right after the reference data is obtained.

In operation S302, a corresponding reference substance for the target region and a concentration of the reference substance is determined.

In an exemplary embodiment, a signal model may be used or assumed to determine the corresponding reference substance and concentration of the reference substance of the target region. For example, the signal model may be given as in the equation 1.

In this case, the reference data obtained in advance in operation S300, the measurement data, and an external factor compensation value may be used. The external factor compensation value is for compensating for an external factor that affects measurement conditions, and the external factor may include characteristics of the quantitative analysis apparatus, e.g., non-uniformity of magnetic fields, characteristics of a specimen used in obtaining the reference data, etc. In an exemplary embodiment, the external factor compensation value may be determined using a Gaussian model. As described above, the Gaussian model may be used or reflected by the signal model in a form that further adds a mathematical expression, such as $e^{-t^2}$ to the signal model. $\zeta$ refers to a Gaussian damping factor that changes the form of the signal model.

In operation S302, a reference substance and concentration of the reference substance of the target region may be determined through curve fitting. Curve fitting may be performed by determining parameters to minimize the difference between the measurement data and estimate data of the target region. The estimate data as herein used refers to data that may be obtained by a signal model implemented with the reference data. Minimum difference estimate data refers to estimate data with the smallest difference from the measurement data of the target region, and may be obtained using the Levenberg-Marquardt algorithm.

An exemplary embodiment of the quantitative analysis method will now be described in more detail.

Figure 22:
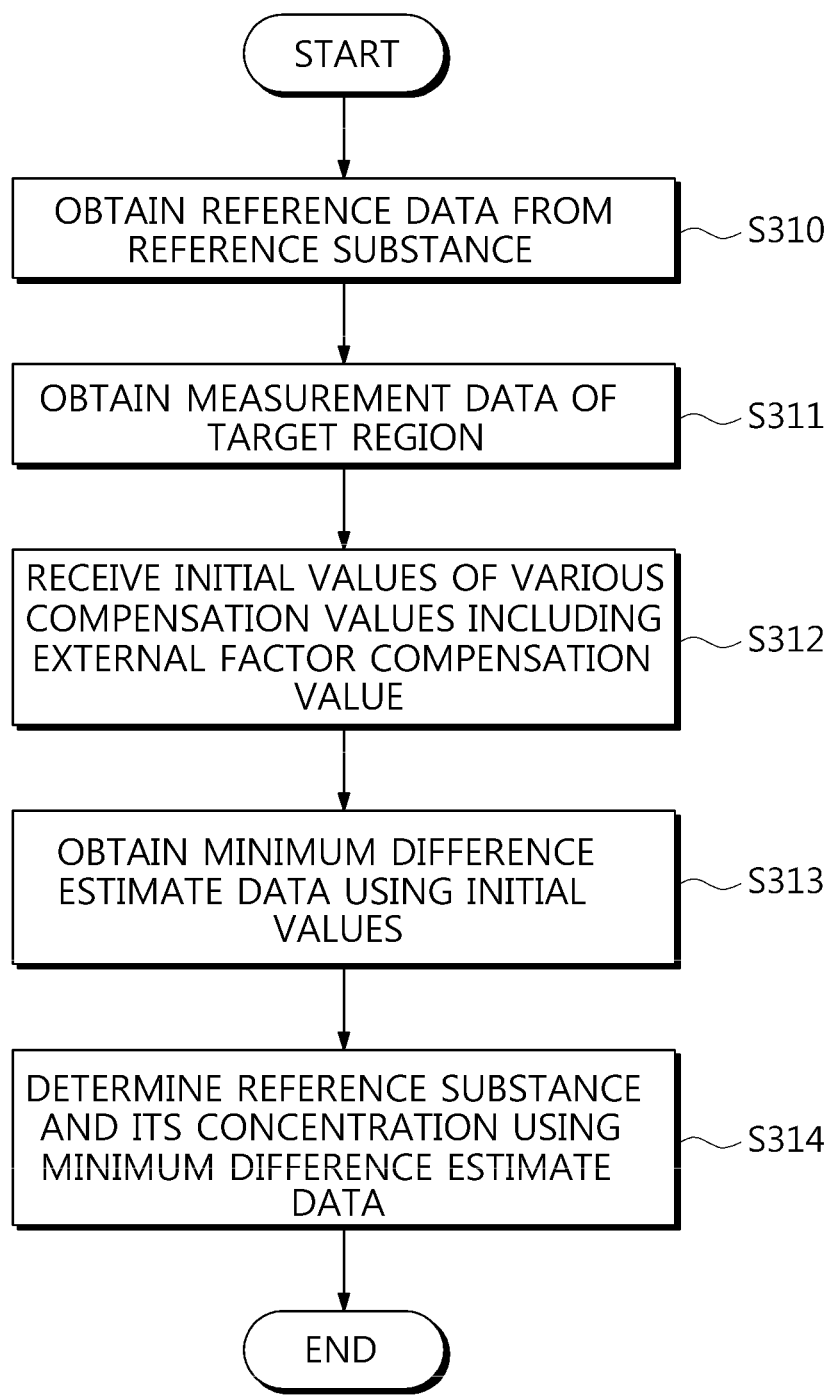
FIG. 22 is a detailed flowchart illustrating a quantitative analysis method, according to an exemplary embodiment.

FIG. 22 is a detailed flowchart illustrating a quantitative analysis method, according to an exemplary embodiment.

Referring to FIG. 22, in operation S310, a quantitative analysis apparatus obtains reference data from a reference substance. In operation S311, the apparatus obtains measurement data of the target region at a moment of time.

In operation S312, the apparatus receives initial values of various compensation values including an external factor compensation value. The initial values are used to minimize a difference between the measurement data of the target region and estimate data. The initial value may also include an initial value for concentration of the reference substance. The various compensation values may include at least one of a basis compensation value, which is a weight for a basis, a reference data compensation value to compensate for an error between reference data and measurement data, and a phase compensation value to compensate for a phase difference between estimate data and measurement data. The various compensation values may include an external factor compensation value. The received initial value may be used in curve fitting.

In operation S313, minimum difference estimate data is obtained using the initial values. The minimum difference estimate data may be obtained by performing curve fitting with the signal model given in the equation 1. To perform curve fitting, at least one of the equations 2 and 3 that reflects the signal model given in the equation 1 may be used. Once the minimum difference estimate data is obtained, the various compensation values and concentration of the reference substance may be determined. If the concentration of a reference substance is zero, it is determined that the reference substance does not exist. Accordingly, obtaining the minimum difference estimate data may lead to determination of whether a reference substance exists.

In operation S314, a reference substance and a concentration of the reference substance are determined using the minimum difference estimate data. The reference substance and its concentration may also be obtained during the procedure of obtaining the minimum difference estimate data.

An exemplary embodiment of a quantitative analysis method will now be described in more detail with reference to FIGS. 23 and 24.

Figure 23:
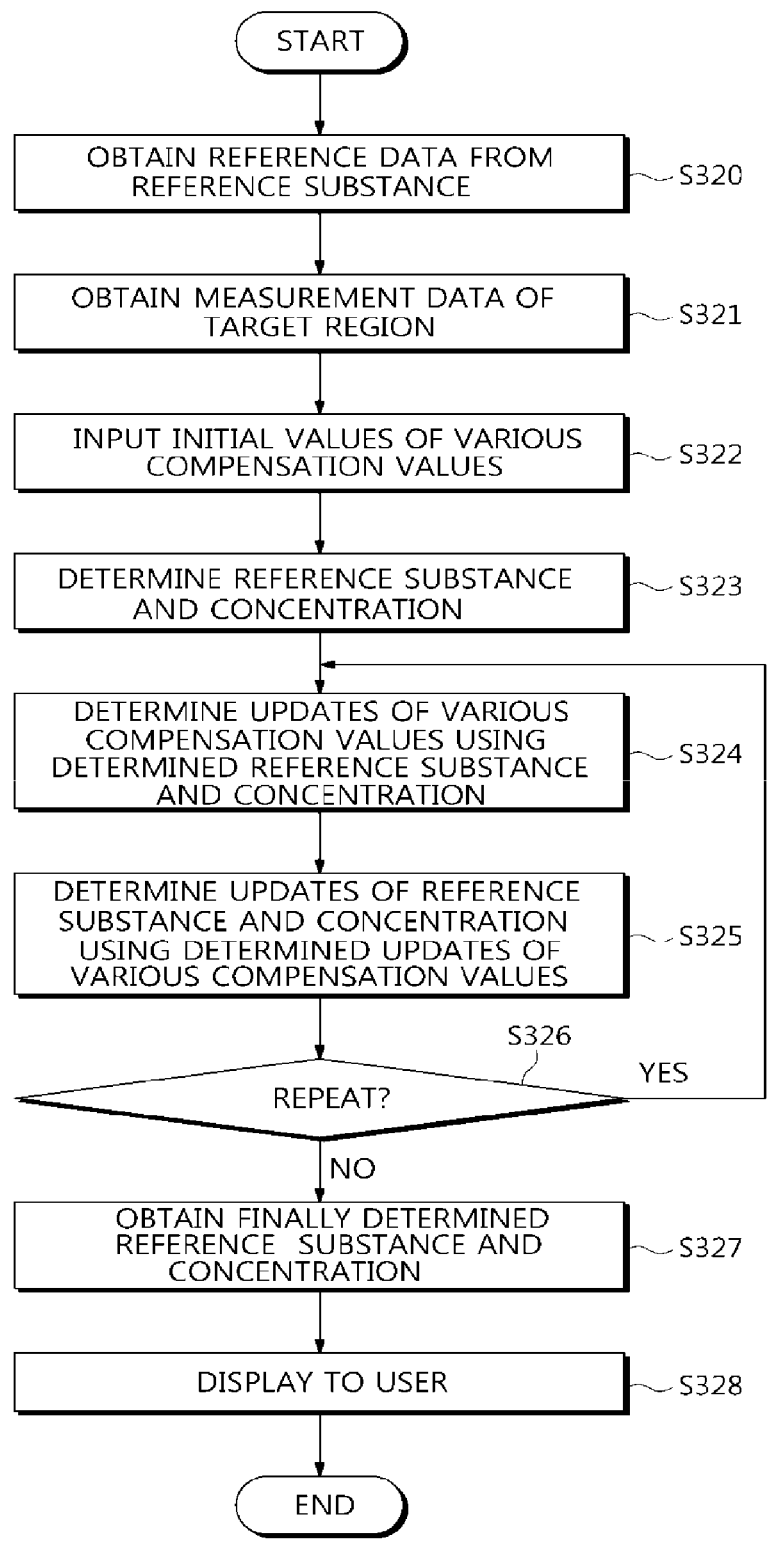
FIG. 23 is a flowchart of a quantitative analysis method, according to an exemplary embodiment.

FIG. 23 is a flowchart of a quantitative analysis method, according to an exemplary embodiment.

In an exemplary embodiment, in operation S320, reference data is obtained from a reference substance. In operation S321, measurement data of a target region is obtained.

In operation S322, initial values of various compensation values including an external factor compensation value, a reference data compensation value, and a phase compensation value are input or determined according to the user or based on what is determined in the system.

In operation S323, a reference substance and a concentration of the reference substance are determined using a curve fitting algorithm obtained based on a signal model. In this case, the signal model may be given in the equation 1, and the curve fitting algorithm may be implemented using the Levenberg-Marquardt algorithm. The curve fitting algorithm may be implemented by the equations 2 to 4.

If the initial values for the external factor compensation value, the reference data compensation value, and the phase compensation value are input, the external factor compensation value, the reference data compensation value, and the phase compensation value are treated as constants in the equations 2 and 3 while other parameters, e.g., the basis compensation value, and the concentration of the reference substance may be treated as variables.

Variable projection (VARPRO) may be used to process multiple parameters together in the process of performing the curve fitting algorithm. With the VARPRO, a new parameter obtained by combining various compensation values may be used in the calculation. The new parameter may include non-linear parameters $\alpha$ and $\beta$, wherein a is a non-linear parameter obtained by combining a phase compensation value, a Gaussian damping factor, and a reference data compensation value, and $\beta$ is a non-linear parameter obtained by combining compensation values to compensate for an error of the reference data and/or T2 time reduction.

A basis compensation value and concentration of the reference substance to minimize at least one of the equations 2 and 3 may be calculated by substituting the input initial values in the at least one of the equations 2 and 3.

In operation S324, updates of the various compensation values are determined using the determined reference substance and concentration.

Once the basis compensation value and the concentration of the reference substance to minimize at least one of the equations 2 and 3 are determined, the basis compensation value and the concentration of the reference substance are treated as constants while the external factor compensation value, reference data compensation value and phase compensation value, which were treated as constants, are treated as variables, and thus an external factor compensation value, reference data compensation value and phase compensation value to minimize the at least one of the equations 2 and 3 may be obtained. The newly obtained external factor compensation value, reference data compensation value and phase compensation value are determined as updates.

In operation S325, updates of the reference substance and the concentration are determined using the updates of the various compensation values. In this case, updates of the basis compensation value and concentration of the reference substance may be obtained using the newly obtained updates of the external factor compensation value, reference data compensation value and phase compensation value instead of the initial values. At least one of the equations 2 and 3 may be used to determine updates of the reference substance and its concentration, and in operation S325, the updates of the external factor compensation value, reference data compensation value and phase compensation value are treated as constants while the basis compensation value and concentration of the reference substance are treated as variables, and thus, updates of the basis compensation value and concentration of the reference substance to minimize the at least one of the equations 2 and 3 may be obtained.

In operation S326, operations S324 and S325 may be repeatedly performed under a condition. Repetition of the operations S324 and S325 may be performed as many as the predetermined number of times, or until estimate data becomes smaller than a value.

In operation S327, the finally determined reference substance, external factor compensation value, reference data compensation value, phase compensation value, basis compensation value, and concentration of the reference substance are obtained. As described above, if the concentration of the reference substance is not equal to zero, the reference substance may be estimated to be present in the target region; and if the concentration of the reference substance is equal to zero, the reference substance may be estimated not to be present in the target region. Accordingly, a type of the reference substance estimated to be present in the target region may also be obtained.

In operation S328, the finally determined reference substance and concentration are reconfigured in a form that may be identified by the user and displayed to the user.

Figure 24:
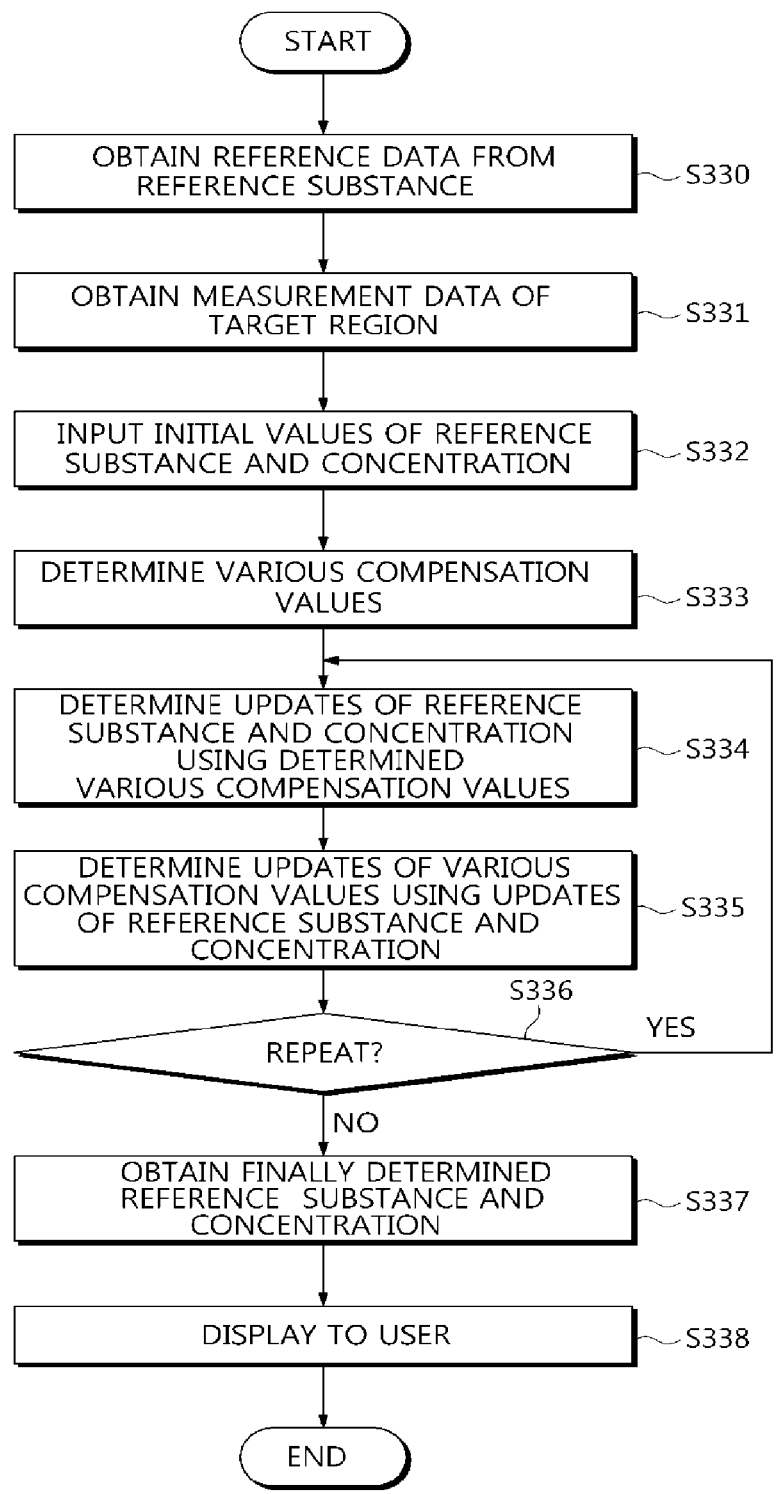
FIG. 24 is a flowchart of a quantitative analysis method, according to another exemplary embodiment.

FIG. 24 is a flowchart of a quantitative analysis method, according to another exemplary embodiment.

In operation S330, reference data is obtained from a reference substance. In operation S331, measurement data of a target region is obtained.

Different from the operation S322 of FIG. 23, in operation S332, initial values for the reference substance and a concentration of the reference substance are input rather than initial values for the external factor compensation value, reference data compensation value, and phase compensation value.

In operation S333, a curve fitting algorithm that may be implemented with a predetermined signal model is used to determine various compensation values. The signal model may be the same as what is given in the equation 1. The curve fitting algorithm may be implemented using the Levenberg-Marquardt algorithm. The curve fitting algorithm may be implemented by one of the equations 2 and 3. The various compensation values may include at least one of the external factor compensation value, reference data compensation value, and phase compensation value. VARPRO may be used to process multiple parameters together in the process of performing the curve fitting algorithm. With the VARPRO, the external factor compensation value, reference data compensation value, and phase compensation value may be combined for processing. In determining the various compensation values, the reference substance and its concentration may be treated as constants while the external factor compensation value, reference data compensation value, and phase compensation value may be treated as variables, and the external factor compensation value, reference data compensation value, and phase compensation value to minimize one of the equations 2 and 3 may be determined.

In operation S334, updates of the reference substance and the concentration are obtained using the determined various compensation values. In this case, the reference substance and its concentration may be treated as variables while the external factor compensation value, reference data compensation value, and phase compensation value may be treated as constants, and updates of the reference substance and its concentration to minimize one of the equations 2 and 3 may be obtained.

In operation S335, updates of the various compensation values, such as the external factor compensation value, the reference data compensation value, and the phase compensation value, are determined using the obtained updates of the reference substance and the concentration. In this case, the updates of the reference substance and its concentration may be reflected by one of the equations 2 and 3, to determine updates of various compensation values, such as the external factor compensation value, the reference data compensation value, and the phase compensation value. In the same way as in operation S334, the reference substance and its concentration may be treated as constants while the external factor compensation value, reference data compensation value, and phase compensation value may be treated as variables, and the external factor compensation value, reference data compensation value, and phase compensation value to minimize one of the equations 2 and 3 may be determined.

In operation S336, operations S334 and S335 are repeatedly performed under a condition. Repetition of the operations S334 and S335 may be performed as many as the predetermined number of times, or until estimate data becomes smaller than a value.

In operation S337, the finally determined reference substance, external factor compensation value, reference data compensation value, phase compensation value, basis compensation value, concentration of the reference substance, and a type of the reference substance are obtained.

In operation S338, the finally determined reference substance and concentration are reconfigured in a form that may be identified by the user and then displayed to the user.

An exemplary embodiment of an MRS method performed with the MRI apparatus will now be described.

Figure 25:
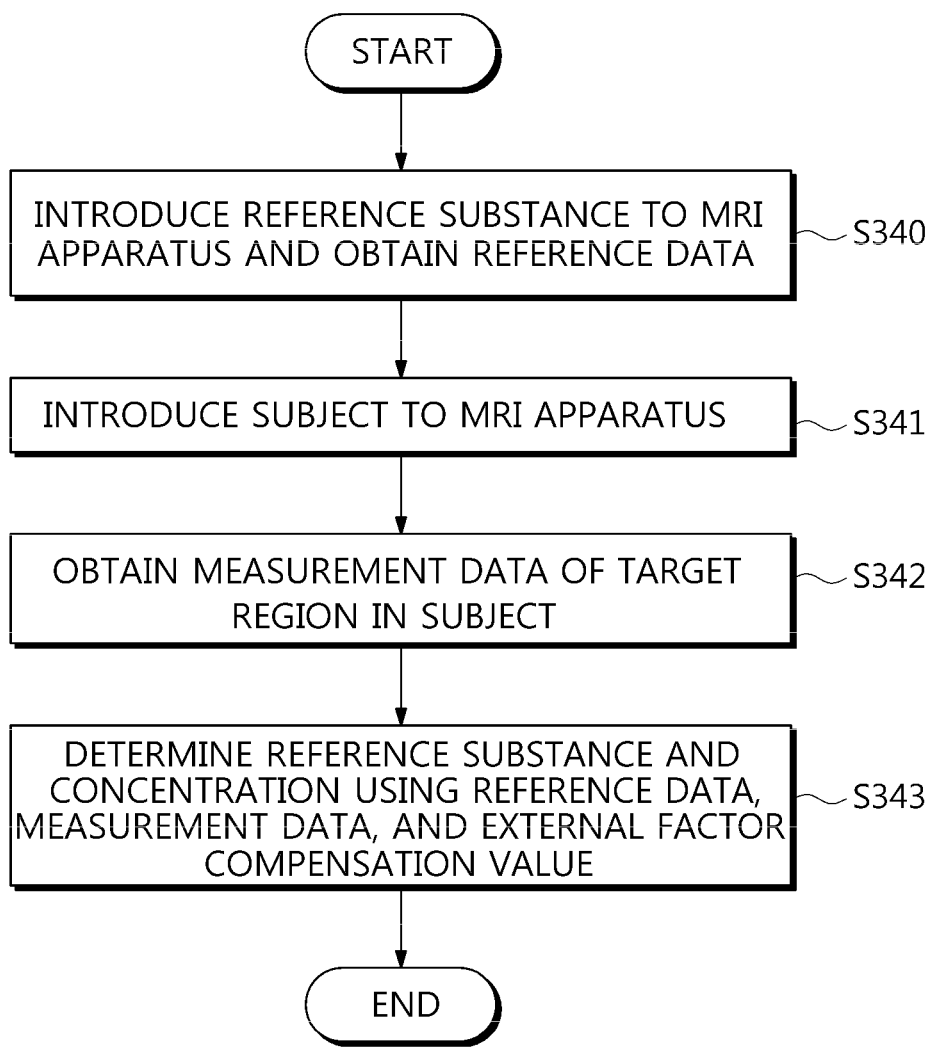
FIG. 25 is a flowchart of a magnetic resonance spectroscopic method, according to an exemplary embodiment.

FIG. 25 is a flowchart of an MRS method, according to an exemplary embodiment.

Referring to FIG. 25, in operation S340, a reference substance is introduced to the MRI apparatus as shown in FIG. 15, and the MRI apparatus obtains reference data of the reference substance. The MRI apparatus may obtain multiple pieces of reference data by performing separate scan on each of multiple reference substances. The reference data may be stored in a storage inside or outside of the MRI apparatus, or in a separate storage that may communicate with the MRI apparatus.

After the multiple pieces of reference data are obtained, in operation S341, a subject is introduced to the MRI apparatus as shown in FIG. 17. In operation S342, the MRI apparatus obtains measurement data of the subject or a target region in the subject by scanning the subject.

In operation S343, a reference substance and a concentration of the reference substance are determined using the reference data, measurement data, and an external factor compensation value. In this case, the external factor compensation value may be determined using a Gaussian model.

The MRI apparatus may determine a reference substance and concentration of the reference substance by further using a reference data compensation value. In this case, the reference data compensation value may include a T2 time compensation value to compensate for reduction in T2 time, which represents a collapse period of magnetization components, and an error compensation value to compensate for an error that occurs in application of the reference data.

The MRI apparatus may determine a reference substance and concentration of the reference substance using a curve fitting algorithm that may be implemented with a signal model. The signal model may be given as in the equation 4, and the curve fitting algorithm may be given as in the equation 2 or 3 implemented with the Levenberg-Marquardt algorithm. The curve fitting algorithm may use an iterative method that determines a reference substance and concentration of the reference substance by alternately obtaining the basis compensation value and concentration of the reference substance, and the reference substance compensation value, external factor compensation value, and phase compensation value, through several iterations.

The quantitative analysis method or the MRS method as described in connection with FIGS. 21 to 25 may be implemented by programs that may be interpreted and executed by an information processing apparatus like the computer, a quantitative analysis apparatus, an MRI apparatus, or the like. The programs may be stored in a storage, such as a magnetic disk recording device, a magnetic tape recording device, an optical disk recording device, or a semiconductor recording device, and the information processing apparatus, quantitative analysis apparatus, or MRI apparatus may access the storage to execute the programs with a central processing unit (CPU).

According to the exemplary embodiments of the MRI apparatus and MRS method using the MRI apparatus, effective quantitative analysis may be performed on a substance inside a subject.

Furthermore, various substances that exist in the subject and/or their composition may be more precisely determined.

In addition, as the composition of a substance inside the subject may be automatically and precisely determined, convenience of manipulation of a quantitative analysis apparatus or MRI apparatus may be increased, and accordingly the user's access to the apparatus may also be enhanced.

Moreover, not a relative concentration of a substance inside the subject but the absolute concentration may be calculated, which allows the user to more exactly determine the presence and composition of the substance in the subject.

Furthermore, the impact of the quantitative analysis apparatus may be minimized as compared to the conventional apparatus and method.

If the MRI apparatus and MRS method using the MRI apparatus is applied in medical or other areas, the user such as a doctor may more exactly determine various substances inside the patient's body, thereby improving accuracy and convenience in patient diagnosis.

The foregoing exemplary embodiments and advantages are examples and are not to be construed as limiting. The present teaching may be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A magnetic resonance spectroscopic method comprising:
    obtaining, by a magnetic resonance imaging (MRI) apparatus, reference data of reference substances;
    obtaining, by the MRI apparatus, measurement data of a target region of a subject;
    determining, by the MRI apparatus, a reference substance of the target region, among the reference substances, and a concentration of the reference substance, using the reference data, the measurement data, and an external factor compensation value compensating for an external factor affecting the measurement data; and
    generating, by the MRI apparatus, a quantitative analysis result as an image according to the reference substance and the concentration.

2. The magnetic resonance spectroscopic method of claim 1, further comprising determining the external factor compensation value, using a Gaussian model.

3. The magnetic resonance spectroscopic method of claim 1, wherein the external factor comprises at least one among characteristics of the MRI apparatus and characteristics of a specimen that is used in the obtaining the reference data.

4. The magnetic resonance spectroscopic method of claim 1, wherein the reference data comprises spectrum information of the reference substance.

5. The magnetic resonance spectroscopic method of claim 1, further comprising:
    determining estimate data, using the reference data and the external factor compensation value; and
    determining minimum difference estimate data with a smallest difference from the measurement data among the estimate data,
    wherein the reference substance and the concentration are determined using the minimum difference estimate data.

6. The magnetic resonance spectroscopic method of claim 5, wherein the estimate data is determined further using a reference data compensation value compensating for an error between the reference data and the measurement data.

7. The magnetic resonance spectroscopic method of claim 5, wherein the minimum difference estimate data is determined using the Levenberg-Marquardt algorithm.

8. The magnetic resonance spectroscopic method of claim 5, wherein the estimate data is determined further using at least one among a basis compensation value that is a weight for a basis, a reference data compensation value compensating for an error between the reference data and the measurement data, and a phase compensation value compensating for a phase difference between the estimate data and the measurement data.

9. The magnetic resonance spectroscopic method of claim 8, further comprising:
    receiving initial values of the external factor compensation value, the reference data compensation value, and the phase compensation value;
    determining the concentration and the basis compensation value, using the initial values; and
    updating the external factor compensation value, the reference data compensation value, and the phase compensation value, using the concentration and the basis compensation value.

10. The magnetic resonance spectroscopic method of claim 9, wherein the minimum difference estimate data is determined by repeatedly performing the determining the concentration and the basis compensation value and the updating the external factor compensation value, the reference data compensation value, and the phase compensation value.

11. The magnetic resonance spectroscopic method of claim 9, wherein the concentration and the basis compensation value minimize a difference between first estimate data that is determined based on the initial values, and the measurement data, and
    the updated external factor compensation value, reference data compensation value, and phase compensation value minimize a difference between second estimate data that is determined based on the concentration and a compensation value, and the measurement data.

12. The magnetic resonance spectroscopic method of claim 5, wherein the estimate data is determined using a signal model based on the reference data, the measurement data, and the external factor compensation value.

13. The magnetic resonance spectroscopic method of claim 12, wherein the signal model is given by a first equation, $$\hat{Y}(v_k) = e^{-j(\phi_0 + v_k \phi_1)} \left[ \sum_{i=1}^{N_B} b_i B_i(v_k) + \sum_{l=1}^{N_M} C_l FT\{m_l(t)e^{-(\beta_l)t}e^{-\zeta t^2}\}(v_k) \right],$$

where $\hat{Y}(v_k)$ is estimate data, j is an arbitrary constant, $\phi_0$ is a zero-order phase compensation value, $\phi_1$ is a first-order compensation value, i is an index to identify a basis, $N_B$ is a number of bases, $b_i$ is a basis compensation value, $B_i(v_k)$ is a basis, $N_M$ is a number of reference substances, l is an index to identify a reference substance, $C_l$ is a concentration of a reference substance with the index l, FT( ) is Fourier transform, $m_l(t)$ is a signal model of a reference substance, $\beta_l$ is a reference data compensation value at the index l, $\zeta$ is a Gaussian damping factor, and $\upsilon_k$ is a frequency.

14. The magnetic resonance spectroscopic method of claim 13, wherein the minimum difference estimate data is determined by calculating a solution to minimize a second equation, $$\|y-\phi(\alpha)c-B(\alpha)b\|_{l_2}^2+\|\lambda_B R_B b\|_{l_2}^2+\|R_p(\beta-\beta^0)\|_{l_2}^2,$$

where y is measurement data, $\phi(\alpha)$ is a part associated with a reference substance with a variable $\alpha$ in a signal model, $B(\alpha)$ is a part associated with a basis with the variable $\alpha$ in the signal model, $\alpha$ is a parameter that is determined by combining parameters used in the signal model through a variable projection, c is a concentration of a reference substance, $\lambda_B$ is a regulation factor for a basis, $R_B$ is a transform to regularize parameters of a basis $B_i(\upsilon_k)$, b is a basis compensation value, $\beta$ is a reference data compensation value, $\beta^0$ is an initial value for the reference data compensation value, and $R_p$ is a transform to regularize a difference between $\beta$ and $\beta^0$.

15. A magnetic resonance imaging (MRI) apparatus, comprising:
a data collector configured to obtain reference data of reference substances, and obtain measurement data of a target region of a subject; and
a processor configured to:
determine a reference substance of the target region, among the reference substances, and a concentration of the reference substance, using the reference data, the measurement data, and an external factor compensation value compensating an external factor affecting the measurement data; and
generate a quantitative analysis result as an image according to the reference substance and the concentration.

16. The magnetic resonance imaging apparatus of claim 15, wherein the processor is further configured to determine the external factor compensation value, using a Gaussian model.

17. The MRI apparatus of claim 15, wherein the external factor comprises at least one among characteristics of the MRI apparatus and characteristics of a specimen that is used in the obtaining the reference data.

18. The magnetic resonance imaging apparatus of claim 15, wherein the reference data comprises spectrum information of the reference substance.

19. The magnetic resonance imaging apparatus of claim 15, wherein the processor is further configured to:
determine estimate data, using the reference data and the external factor compensation value; and
determine minimum difference estimate data with a smallest difference from the measurement data among the estimate data,
wherein the reference substance and the concentration is determined using the minimum difference estimate data.

20. The magnetic resonance imaging apparatus of claim 19, wherein the estimate data is determined further using a reference data compensation value compensating for an error between the reference data and the measurement data.

21. The magnetic resonance imaging apparatus of claim 19, wherein the minimum difference estimate data is determined using the Levenberg-Marquardt algorithm.

22. The magnetic resonance imaging apparatus of claim 19, wherein the estimate data is determined further using at least one among a basis compensation value that is a weight for a basis, a reference data compensation value compensating for an error between the reference data and the measurement data, and a phase compensation value compensating for a phase difference between the estimate data and the measurement data.

23. The magnetic resonance imaging apparatus of claim 22, wherein the processor is further configured to:
receive initial values of the external factor compensation value, the reference data compensation value, and the phase compensation value;
determine the concentration and the basis compensation value, using the initial values; and
update the external factor compensation value, the reference data compensation value, and the phase compensation value, using the concentration and the basis compensation value.

24. The magnetic resonance imaging apparatus of claim 23, wherein the minimum difference estimate data is determined by the processor repeatedly determining the concentration and the basis compensation value and updating the external factor compensation value, the reference data compensation value, and the phase compensation value.

25. The magnetic resonance imaging apparatus of claim 24, wherein the concentration and the basis compensation value minimize a difference between first estimate data that is determined based on the initial values, and the measurement data, and
the updated external factor compensation value, reference data compensation value, and phase compensation value minimize a difference between second estimate data that is determined based on the concentration and a compensation value, and the measurement data.

26. The magnetic resonance imaging apparatus of claim 22, wherein the processor is further configured to:
receive initial values of the concentration and the basis compensation value;
determine the external factor compensation value, the reference data compensation value, and the phase compensation value, using the initial values; and
update the concentration and the basis compensation value, using the external factor compensation value, the reference data compensation value, and the phase compensation value.

27. The magnetic resonance imaging apparatus of claim 19, wherein the estimate data is determined using a signal model based on the reference data, the measurement data, and the external factor compensation value.

28. The magnetic resonance imaging apparatus of claim 27, wherein the signal model is given by a first equation, $$\hat{Y}(v_k) = e^{-j(\phi_0+v_k\phi_1)}\left[\sum_{i=1}^{N_B}b_i B_i(v_k) + \sum_{l=1}^{N_M}C_l FT\{m_l(t)e^{-(\beta_l)t}e^{-\zeta t^2}\}(v_k)\right],$$

where $\hat{Y}(v_k)$ is estimate data, j is an arbitrary constant, $\phi_0$ is a zero-order phase compensation value, $\phi_1$ is a first-order compensation value, i is an index to identify a basis, $N_B$ is a number of bases, $b_i$ is a basis compensation value, $B_i(\upsilon_k)$ is a basis, $N_M$ is a number of reference substances, l is an index to identify a reference substance, $C_l$ is a concentration of a reference substance with the index l, FT( ) is Fourier transform, $m_l(t)$ is a signal model of a reference substance, $\beta_l$ is a reference data compensation value at the index l, $\zeta$ is a Gaussian damping factor, and $\upsilon_k$ is a frequency.

29. The magnetic resonance imaging apparatus of claim 28, wherein the minimum difference estimate data is determined by calculating a solution to minimize a second equation, $$\|y-\phi(\alpha)c-B(\alpha)b\|_{l_2}^2+\|\lambda_B R_B b\|_{l_2}^2+\|R_p(\beta-\beta^0)\|_{l_2}^2,$$

where y is measurement data, $\phi(\alpha)$ is a part associated with a reference substance with a variable $\alpha$ in a signal model, $B(\alpha)$ is a part associated with a basis with the variable $\alpha$ in the signal model, $\alpha$ is a parameter that is determined by combining parameters used in the signal model through a variable projection, c is a concentration of a reference substance, $\lambda_B$ is a regulation factor for a basis, $R_B$ is a transform to regularize parameters of a basis $B_i(\upsilon_k)$, b is a basis compensation value, $\beta$ is a reference data compensation value, $\beta^0$ is an initial value for the reference data compensation value, and $R_p$ is a transform to regularize a difference between $\beta$ and $\beta^0$.

30. The magnetic resonance imaging apparatus of claim 15, wherein the data collector comprises:
   a magnetostatic field coil configured to generate a magnetostatic field for the subject;
   a gradient coil configured to generate a gradient field for the subject; and
   a radio frequency (RF) coil configured to apply an RF signal to the subject to which the magnetostatic field and the gradient field are generated, and
   the data collector is further configured to induce a magnetic resonance phenomenon in the subject, and receive a magnetic resonance signal that is generated based on the induced magnetic resonance phenomenon to obtain the reference data and the measurement data.

* * * * *